(12) United States Patent  
Horibata et al.

(10) Patent No.: US 6,650,522 B2
(45) Date of Patent: Nov. 18, 2003

(54) SEMICONDUCTOR RELAY SYSTEM AND METHOD FOR CONTROLLING THE SEMICONDUCTOR RELAY SYSTEM

(75) Inventors: Kenji Horibata, Kyoto (JP); Teruyuki Nakayama, Kyoto (JP); Toshiyuki Nakamura, Kyoto (JP); Takaaki Yamada, Kyoto (JP); Yuji Hashimoto, Kyoto (JP); Kazuhiro Harada, Kyoto (JP)

(73) Assignee: Omron Corporation, Kyoto (JP)

( * ) Notice: Subject to any disclaimer, the term of this patent is extended or adjusted under 35 U.S.C. 154(b) by 11 days.

(21) Appl. No.: 09/987,691

(22) Filed: Nov. 15, 2001

(65) Prior Publication Data

US 2002/0060894 A1 May 23, 2002

(30) Foreign Application Priority Data

Nov. 21, 2000 (JP) .................................. 2000-354142
Dec. 14, 2000 (JP) .................................. 2000-380026

(51) Int. Cl.$^7$ ................................................. H02H 3/08
(52) U.S. Cl. ................................. 361/93; 361/100
(58) Field of Search ................... 361/100, 86, 58, 361/88, 59, 93

(56) References Cited

U.S. PATENT DOCUMENTS 4,926,281 A * 5/1990 Murphy ...................... 361/55
5,119,312 A * 6/1992 Groger et al. ............... 702/60
5,319,514 A * 6/1994 Walsh et al. ................. 361/59

\* cited by examiner

Primary Examiner—Gregory J. Toatley, Jr.
Assistant Examiner—Boris Benenson
(74) Attorney, Agent, or Firm—Foley & Lardner

(57) ABSTRACT

Because a semiconductor relay system of this invention comprises an across-element voltage detecting circuit 116 which delivers an across-element voltage detection signal depending on the presence/absence of an across-element voltage exceeding a predetermined threshold; an element driving circuit 112 for delivering an element driving signal in response to a control input signal; a logic-based judgement circuit 119 for delivering a logic-based judgement signal depending on the presence/absence of an across-element voltage detection signal; and a filtration circuit for removing a logic-based judgement signal of external disturbing elements to produce an element safety check signal, it is possible to reliably detect the disorder of a triac 114.

29 Claims, 20 Drawing Sheets

(a) ACROSS-ELEMENT VOLTAGE

DETECTION THRESHOLD (b) ACROSS-ELEMENT VOLTAGE DETECTING SIGNAL

FIG.5
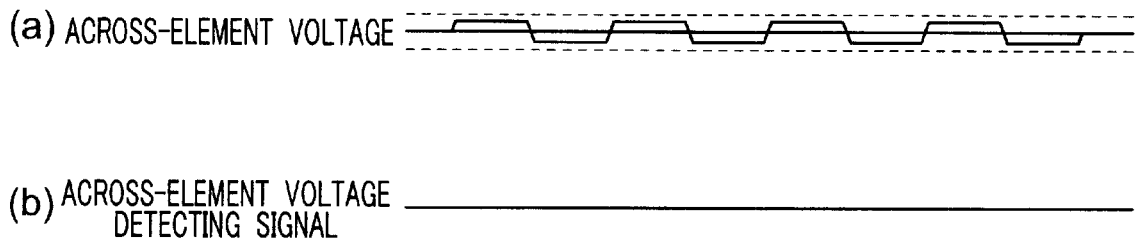
(a) ACROSS-ELEMENT VOLTAGE
(b) ACROSS-ELEMENT VOLTAGE DETECTING SIGNAL
FIG.6
|  | ELEMENT DRIVING SIGNAL | |
|---|---|---|
|  | H | L |
| ACROSS-ELEMENT VOLTAGE DETECTING SIGNAL — H | OFF DISORDER | NORMAL |
| ACROSS-ELEMENT VOLTAGE DETECTING SIGNAL — L | NORMAL | ON DISORDER |
FIG.7
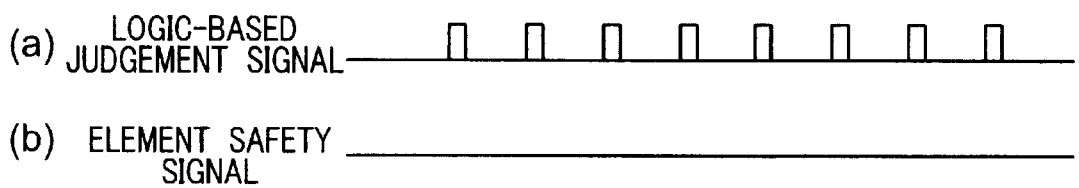
(a) LOGIC-BASED JUDGEMENT SIGNAL
(b) ELEMENT SAFETY SIGNAL

SEMICONDUCTOR RELAY SYSTEM AND METHOD FOR CONTROLLING THE SEMICONDUCTOR RELAY SYSTEM

FIELD OF THE INVENTION

The present invention relates to a semiconductor relay system such as a solid state relay (to be referred to simply as SSR hereinafter), more particularly to a semiconductor relay system having a function to detect a disorder.

PRIOR ART

A semiconductor relay system such as an SSR is for driving a direct load such as a heater, motor, solenoid, etc. For example, an SSR, being driven and controlled by a temperature regulator, controls current passing through a heater or its direct load.

The SSR drives/controls a direct load such as a heater, by switching on/off a semiconductor element such as a triac, based on an element driving signal in response to a control input signal, for example, delivered by a temperature regulator. For example, if the semiconductor element is turned on, voltage across the semiconductor element falls and heat is generated. Therefore, to dissipate the heat, it will be necessary to introduce a heat sink.

Such a conventional semiconductor relay system as described above is often installed in a control panel. However, because the chamber of control panel is made so air-tight that the convection of air thereof is not sufficient, and ambient temperature tends to be high, the semiconductor relay system may be heated to an unduly high temperature, which may cause the semiconductor element such as a triac to be shunted for failure.

In spite of this, according to the conventional semiconductor relay system, it is impossible to reliably detect the failure of the semiconductor element thereof.

This invention has been proposed with the aforementioned situation as a background, and its object is to provide a semiconductor relay system capable of reliably detecting a disorder of a semiconductor element portion thereof.

DISCLOSURE OF THE INVENTION

To attain the above object, the semiconductor relay system of this invention comprising a semiconductor element portion which is inserted between terminals to connect/intercept passage between the terminals in response to an element driving signal, characterized by further comprising a sensor portion which monitors the operation of the semiconductor element portion and delivers a sensor output signal based on the monitoring result; and an element disorder detecting circuit which checks for the presence/absence of a disorder in the semiconductor element portion, based on the element driving signal and the sensor output signal.

As seen from above, according to this invention it is possible to reliably detect a disorder in the semiconductor element portion, because, according to the semiconductor relay system of this invention, detection of a disorder in the semiconductor element portion is achieved based on a sensor output signal incoming from the sensor portion which monitors the operation of the semiconductor element portion, and an element driving signal responsible for driving of the semiconductor element portion.

According to the semiconductor relay system of this invention, the sensor portion comprises an across-element voltage detecting circuit which detects voltage across the semiconductor element portion, and delivers an across-element voltage detection signal, i.e., a sensor output signal based on the detection result; and the element disorder detecting circuit checks for the presence/absence of a disorder in the semiconductor element portion based on the across-element voltage detection signal and the element driving signal.

As seen from above, according to this invention it is possible to reliably detect a disorder in the semiconductor element portion, because, according to the semiconductor relay system of this invention, detection of a disorder in the semiconductor element portion is achieved based on an across-element voltage detection signal indicating the voltage across the semiconductor element portion, and an element driving signal. Moreover, according to this invention it is possible to greatly reduce the size of the system as compared with a semiconductor relay system incorporating a CT (current transformation) type current sensor.

According to the semiconductor relay system of this invention, the across-element voltage detecting circuit delivers an across-element voltage detection signal depending on the presence/absence of an across-element voltage; and the element disorder detecting circuit comprises a logic-based judgement circuit which delivers a logic-based judgement signal depending on the presence/absence of an across-element voltage detection signal and of an element driving signal, and a filtration circuit which delivers an element safety check signal reflecting the presence/absence of a disorder in the semiconductor element portion based on the logic-based judgement signal.

As seen from above, according to this invention it is possible to deliver an accurate element safety check signal being removed of noises accompanying a logic-based judgement signal, because, according to the semiconductor relay system of this invention, delivery of a logic-based judgement signal is achieved depending on the presence/absence of an across-element voltage and of an element driving signal, and delivery of an element safety check signal reflecting the presence/absence of a disorder in the semiconductor element portion is achieved based on the logic-based judgement signal.

The semiconductor relay system of this invention comprises a power circuit for supplying power at least to either the across-element voltage detecting circuit or the element disorder detecting circuit, and the power circuit are supplied power by a load power circuit connected to the terminals.

As seen from above, according to this invention it is possible to securely prevent the across-element voltage detecting circuit and the element disorder detecting circuit from making an erroneous detection of a disorder in the semiconductor element portion, even if power supply from the load power circuit is discontinued, because then power supply to the across-element voltage detection circuit and to the element disorder detecting circuit is also discontinued.

The semiconductor relay system of this invention comprises a load circuit for driving a load being energized by a load power supply, and a semiconductor element portion for controlling the load circuit, and further comprises a dummy load portion connected in parallel with the load, and a control circuit for controlling the dummy load portion and the semiconductor element portion.

Further, the semiconductor relay system of this invention comprises a load circuit for driving a load being energized by a load power supply, and a semiconductor element portion for controlling the load circuit, and further comprises a dummy load portion connected in parallel with the load; a for-safety intercepting portion for connecting/intercepting the load with or from the lord power supply in the load circuit; and a control circuit for controlling the dummy load portion, semiconductor element portion and for-safety intercepting portion.

The semiconductor relay system of this invention comprises a load circuit for driving a load being energized by a load power supply; a for-safety intercepting portion having contacts through which connection/interception of the load with/from the load power supply is achieved in the load circuit; a dummy load portion which enables disorder detection by insuring a route for the passage through the semiconductor element portion in case passage through the load is intercepted; and a control means, wherein the control means puts the system into an initial check state when power is turned on during a state where no power is supplied to the semiconductor element portion, dummy load portion and for-safety intercepting portion, and then checks for the presence of disorder in the for-safety intercepting portion; when it finds, based on the detection result, the for-safety intercepting portion is not in disorder, the control means checks for the presence of disorder in the semiconductor element portion; and when it finds, based on the detection result, the semiconductor element portion is not in disorder, the control means insures connection of the for-safety intercepting circuit, thereby putting the load circuit into operation.

Alternatively, the control means, when it finds the for-safety intercepting portion is normal, checks for the presence of disorder in the semiconductor element portion for a definite period by insuring a route in the dummy load portion for the current passing through the semiconductor element portion, and when it finds the semiconductor element portion is normal, discontinues the disorder detection of the semiconductor element portion, and insures connection of the for-safety intercepting portion to put it into operation, thereby activating the load circuit.

Further alternatively, the control means, when it finds the for-safety intercepting portion is in disorder, does not check the semiconductor element portion for the presence of disorder in the dummy load portion, thereby preventing the load circuit from being activated, and when it finds the semiconductor element portion is in disorder, it controls such that the load circuit can not be put into operation.

As seen from above, according to the semiconductor relay system of this invention, when power is turned on during a state where no power is supplied to the semiconductor element portion, dummy load portion and for-safety intercepting portion, an initial check state is introduced wherein disorder of the for-safety intercepting portion is checked; when the for-safety intercepting portion is not found to be in disorder based on the check result, the semiconductor element portion is checked for disorder, or checking the semiconductor element portion for disorder is achieved by insuring a route in the dummy load portion for the current passing through the semiconductor element portion; and then to put the for-safety intercepting portion into operation, thereby putting the system into continuous operation.

Further, according to the semiconductor relay system of this invention, if the control means finds the for-safety intercepting portion is in disorder based on the disorder detection result of the for-safety intercepting portion, it arrests the system while delivering an alarm informing the presence of disorder. Similarly, when the control means finds the semiconductor element portion is in disorder, it arrests the system while delivering an alarm informing the presence of disorder. Thus, in case a disorder sets in, the system controls such that the load circuit is put out of operation.

Because the system quickly detects the onset of disorder thanks to the above feature, it is possible to improve the safety of the system. Further, because the system does not permit the entry of a driving signal until it has checked the safety of the system itself, the safety of the entire system is further improved.

Further, because the sensor can detect the degradation of properties of the semiconductor element portion, the system can intercept the load circuit via the for-safety intercepting circuit before the system falls to a complete failure, or can direct, by delivering an alarm, the attention of the operator to a disorder to urge him to arrest the system before the system falls to a dangerous state. This will result in the further improvement of the safety of the system.

Alternatively, the system comprises an element driving circuit for driving the semiconductor element portion by delivering an element driving signal, and the control means monitors the for-safety intercepting portion, and when it finds the contacts of the for-safety intercepting portion are not open, the control means prevents the element driving circuit from delivering an element driving signal.

Alternatively, the control means controls such that, when power supply is turned on, current is passed through the semiconductor element portion via the dummy load, thereby checking the semiconductor element portion for normality, and when the normality of the portion in question is confirmed, the contacts of the for-safety intercepting portion are closed.

Alternatively, the system comprises an element disorder detecting circuit for detecting a disorder in the semiconductor element portion, and the control means controls such that when the element disorder detecting means finds the semiconductor element portion is in disorder during normal operation, the contacts of the for-safety intercepting portion are opened.

Alternatively, the control means controls such that the contacts of the for-safety intercepting portion are opened when the system is put out of operation.

The control means comprises a sensor portion for monitoring the operation of semiconductor element portion; an element disorder detecting circuit for comparing a sensor output signal from the sensor portion with an element driving signal from an element driving circuit, which, when it finds the semiconductor element portion is normally operable (free from shunting or opening disorder), delivers an element safety check signal; an intercepting circuit monitoring circuit which, when it finds a for-safety intercepting portion is normally operable (welding of contacts does not occur)(for example, when it confirms the "b" contacts of the relay contacts of intercepting relay are closed), delivers a dummy load signal to a dummy load portion to cause an intercepting relay safety check signal to be delivered, and, when it can not confirm the safety of the semiconductor element portion, is kept from delivering an intercepting relay safety check signal; and an initial control circuit which, when power is turned on, causes the dummy load relay of dummy load portion to be activated for a certain period, thereby checking for the safety of semiconductor elementary portion, and which, at the above state, intercepts the entry of a control input signal from outside, causes an element portion booting check operation signal to enter the element driving portion, and which, at the above state, causes an for-safety interception check signal to enter the intercepting circuit monitoring circuit, thereby checking for the welding of for-safety intercepting portion.

The semiconductor element portion is constituted of a semiconductor switching element such as an MOSFET, transistor, triac, thyristor, or the like.

The semiconductor relay system of this invention still further comprises a load circuit for driving a load being energized by a load power supply; a semiconductor element portion for controlling the load circuit; an element driving circuit for driving the semiconductor element portion via an element driving signal; a for-safety intercepting portion having contacts through which connection/interception of the load with/from the load power supply is achieved in the load circuit; a sensor portion for monitoring the operation of the semiconductor element portion; an element disorder detecting circuit for detecting disorder in the semiconductor element portion by comparing a sensor output signal from the sensor portion with an element driving signal from the element driving circuit, and for delivering an element safety check signal, when it finds the semiconductor element portion is in disorder; a dummy load portion which enables disorder detection by insuring a route for the passage through the semiconductor element portion in case passage through the load is intercepted; an intercepting circuit monitoring circuit which, when it finds the for-safety intercepting portion is normally operable, delivers an intercepting relay safety check signal; an initial control circuit which, when power is turned on, activates the dummy load portion to enable the safety of the semiconductor element portion to be checked, intercepts the entry of a control input signal from outside, thereby allowing an element portion initial check signal to enter the element driving circuit, and a for-safety intercepting portion check signal to enter the intercepting circuit monitoring circuit, so as to check the welding of contacts of the for-safety intercepting portion; and a logic circuit which delivers a safety check signal to the for-safety intercepting portion when it finds the element safety check signal and the intercepting relay safety check signal rising to a high level.

Alternatively, the sensor portion is a photo-coupler connected in parallel with the semiconductor element portion. The sensor portion detects a voltage across the semiconductor element portion, and delivers a sensor output signal to the element disorder detecting circuit.

According to the semiconductor relay system of this invention, the for-safety intercepting portion may be constituted of an intercepting relay consisting of a safety relay, or of an electromagnetic relay having at least one contact which is normally kept open, or of an combination of a safety relay and a common relay, or of a semiconductor element having a high voltage tolerance.

An intercepting relay of the for-safety intercepting portion may be controlled at any time as needed by means of an element driving signal fed to the semiconductor element portion. In this case, because the intercepting relay is turned off as appropriate, security of its interception can be improved.

The safety relay is a relay incorporated in a circuit for insuring safety and configured such that, through a forcibly guiding mechanism, when any one of "a" contacts is welded, all the "b" contacts are turned off, while when any one of "b" contacts is welded, all the "a" contacts are turned off.

According to the semiconductor relay system of this invention, the dummy load portion may be inserted between the semiconductor element portion and the for-safety checking portion, in parallel with the load; or the dummy load portion may comprise a resistance and an electromagnetic relay connected in series; or the dummy load portion may comprise a resistance through which only a feeble current (for example, one tenth ($1/10$) of that passing through the load) is allowed to pass. Further, the electromagnetic relay of the dummy load portion may comprise a "b" contact of the same safety relay with that used for for-safety interception.

The sensor portion may comprise a voltage detecting circuit for detecting voltage across the semiconductor element portion.

The sensor portion may comprise a photo-coupler connected in parallel with the semiconductor element portion. The sensor portion detects voltage across the semiconductor element portion, and delivers a sensor output signal to the element disorder detecting circuit.

The sensor portion may comprise a current detecting circuit for detecting current flowing through the semiconductor element portion. The sensor portion detects current flowing through the semiconductor element portion, and delivers a sensor output signal to the element disorder detecting circuit.

Each of the sensor portion and the element disorder detecting circuit may be paired so that for each of them, if one pair is broken, the other can be readily introduced to insure normal operation. This will improve the fault tolerance of the system.

The semiconductor relay system of this invention may be configured such that the for-safety intercepting portion can be forcibly opened in response to a safety control signal from outside.

The semiconductor relay system of this invention may have a function to deliver a safety control signal to outside, and an additional function to modify the signal, when it detects a disorder in its interior, such that the signal can inform of the disorder.

The semiconductor relay system of this invention may comprise a semiconductor relay working on a three phase AC supply, and be configured such that the for-safety intercepting portion intercepts two phases of current.

According to the control method applied to the semiconductor relay system of this invention, the system introduces an initial check state when power is turned on at a state where no power is supplied to the semiconductor element portion, dummy load portion and for-safety intercepting portion, thereby enabling the for-safety intercepting portion to be checked for its normality; when it finds the for-safety intercepting portion is not in disorder based on the check result, the system checks for the normality of the semiconductor element portion; when it finds the semiconductor element portion is not in disorder based on the check result, the system insures connection of the for-safety intercepting portion, thereby putting the load into continuous activation; however when it finds the for-safety intercepting portion is in disorder based on the check result, the system does not check for the normality of the dummy load portion, but controls such that the load circuit is kept from being activated; and further when it finds the semiconductor element portion is in disorder based on the check result, the system controls such that the load circuit is kept from being activated.

As seen from above, according to the semiconductor relay system of this invention, because the system quickly detects the onset of disorder, it is possible to improve the safety of the system. Further, because the system does not permit the entry of a driving signal until it has checked the safety of the system itself, the safety of the entire system is further improved.

Further, because the sensor can detect the degradation of properties of the semiconductor element portion, the system can intercept the load circuit via the for-safety intercepting circuit before the system falls to a complete failure, or can direct, by delivering an alarm, the attention of the operator to a disorder to urge him to arrest the system before the system falls to a dangerous state. This will result in the further improvement of the safety of the system.

BRIEF DESCRIPTION OF THE DRAWINGS

FIG. 5 shows signal wave traces representing the relationship between an across-element voltage and an across-element voltage detection signal when a triac related with the first embodiment is turned on.

FIG. 6 shows an algorithm necessary for judgment in relation with an element driving signal and an across-element detection signal of the first embodiment.

FIG. 7 shows signal wave traces representing a logic-based judgement signal and an element safety signal when the triac related with the first embodiment is rightly turned off.

FIG. 9 shows signal wave traces representing a logic-based judgement signal and an element safety signal when the triac related with the first embodiment is wrongly turned on.

FIG. 12 shows signal wave traces representing a power voltage, element driving signal, across-element voltage detection signal, logic-based judgement signal and element safety signal, when the triac related with the first embodiment is wrongly turned on.

FIG. 21 is a time chart of the signals generated in the semiconductor relay system when an opening disorder sets in.

FIG. 22 is a time chart of the signals generated in the semiconductor relay system when a shunting disorder sets in.

BEST MODE FOR CARRYING OUT THE INVENTION

The embodiments of the invention will be described with reference to accompanying drawings.

(Embodiment 1)

Figure 1:
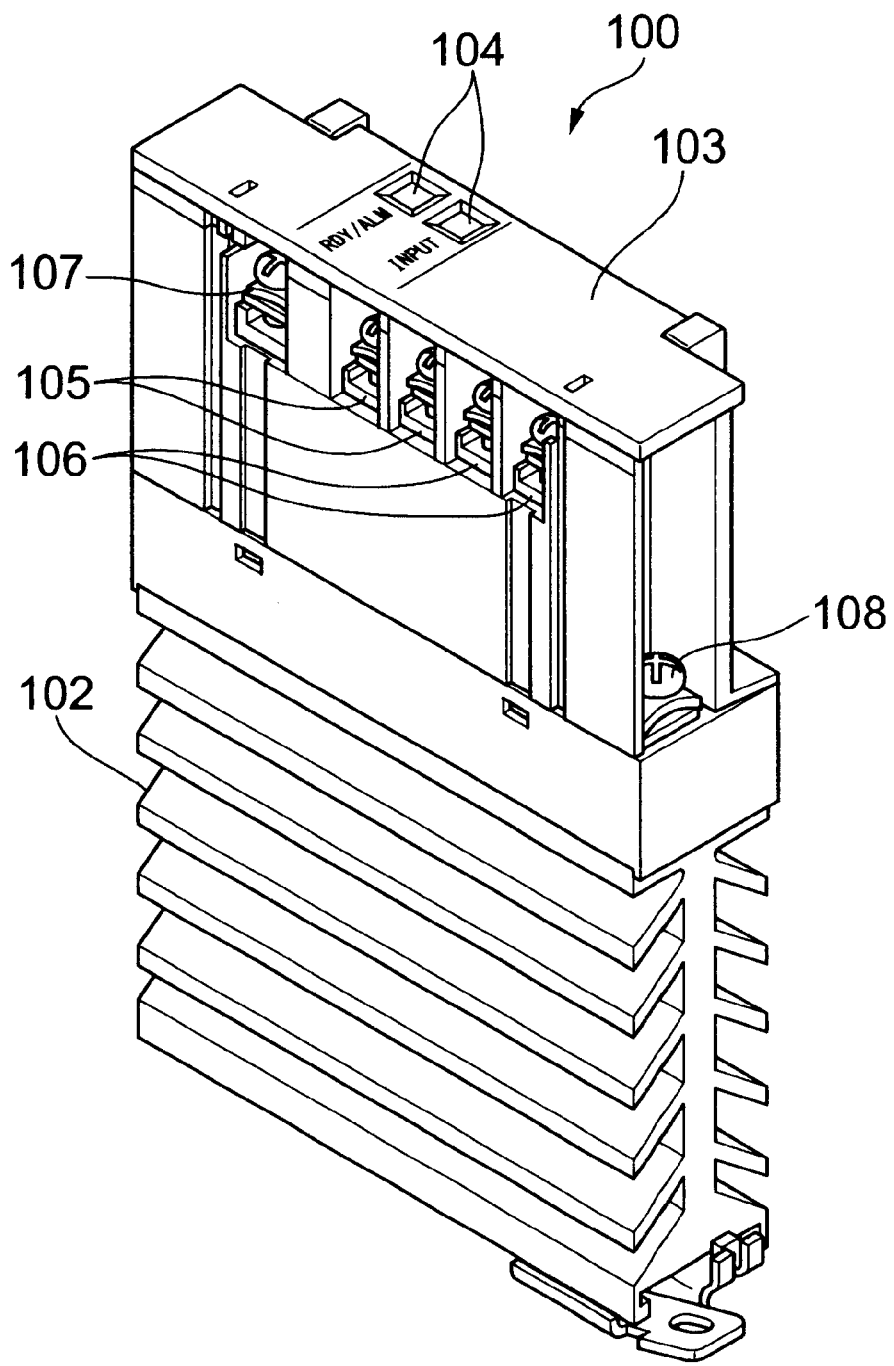
FIG. 1 is a perspective view to show the external outlook of an SSR representing a first embodiment of the semiconductor relay system of this invention with its construction.

FIG. 1 is a perspective view to show the external outlook of an SSR representing a first embodiment of the semiconductor relay system of this invention with its construction.

The SSR 100 shown in FIG. 1 is fixed with screws to a heat sink 102; on the top surface of SSR 100 is attached an undulatory cover 103; the cover 103 has openings 104 formed therethrough corresponding with indicator LEDs which inform by lighting how an input is fed, and how an alarming output is delivered.

Beneath the cover 103 there are provided five terminals including a pair of input terminals 105, a pair of alarming output terminals 106 and a power supply terminal 107. In addition, on both the longitudinal ends of SSR 100, there are provided a pair of output terminals 108 (only one of the terminals is shown in FIG. 1 as indicated by numeral 108) connected one to a load power supply and the other to a load such as a heater.

Figure 2:
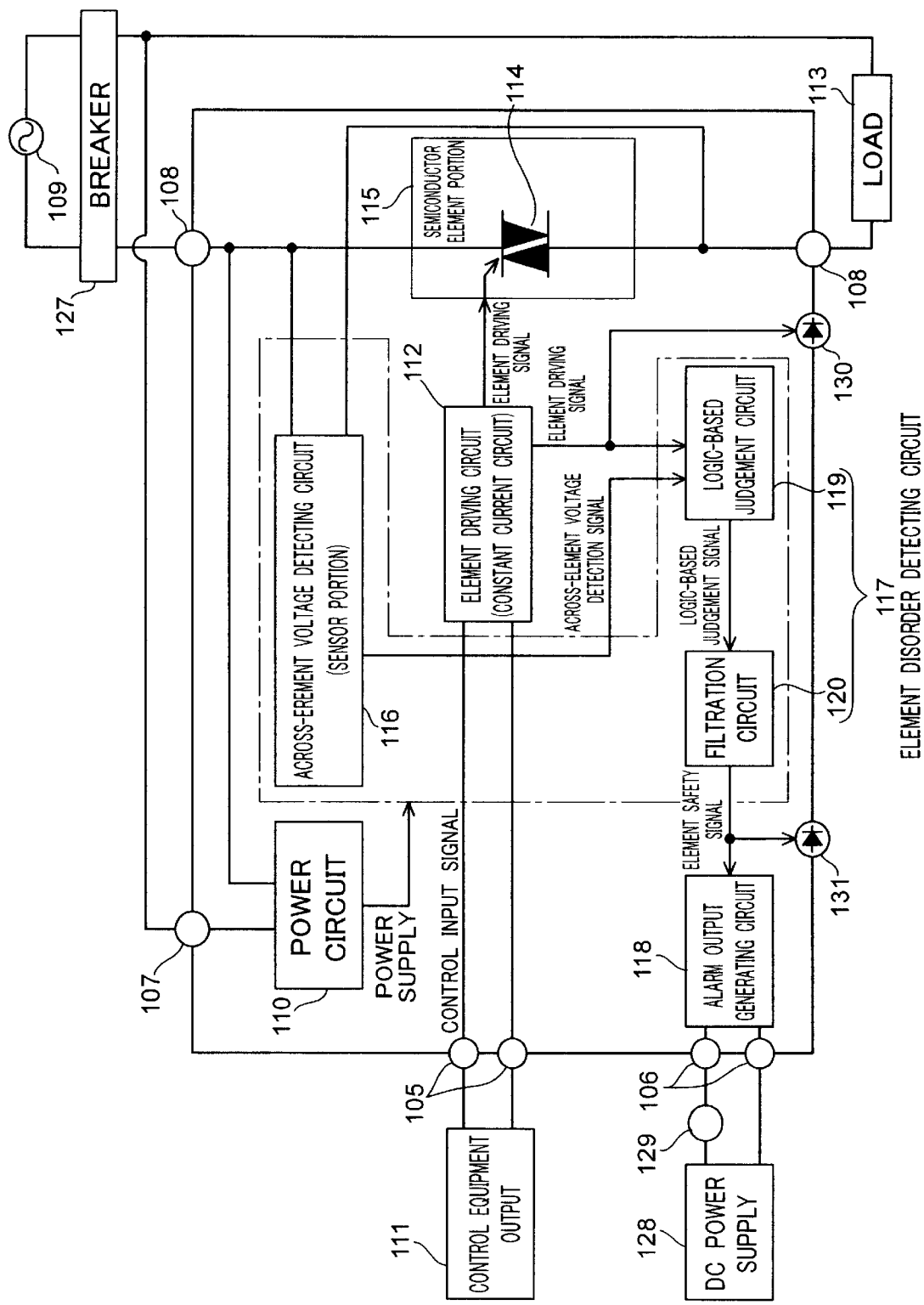
FIG. 2 is a block diagram to show the simplified structure of SSR representing the first embodiment of this invention.

FIG. 2 is a block diagram to show the simplified structure of SSR 100 representing the first embodiment of this invention.

SSR 100 shown in FIG. 2 comprises a power supply circuit 110 for supplying power to a circuit for detecting a disorder, after having received power supplied via an external load power supply circuit 109, thereby generating, for example, an internal power supply with a constant voltage of 5V; input terminals 105 for receiving a control input signal from a control unit such as a temperature regulator; a semiconductor element driving circuit 112 which, in response to a control input signal via the input terminals, delivers an element driving signal; output terminals 108 connected in-series with a load 113 such as a heater and the load power supply circuit 109; and a semiconductor element portion 115 with a semiconductor element or triac inserted between both output terminals 108.

In order to detect a disorder of triac 114, the SSR 100 representing the first embodiment is configured as below.

The SSR100 comprises, as a sensor for detecting the voltage across triac 114, an across-semiconductor voltage detecting circuit 116; a semiconductor's disorder detecting circuit 117 which checks the triac 114 for disorder based on an across-semiconductor voltage detection signal or a sensor output signal from the across-semiconductor voltage detecting circuit 116 and a semiconductor driving signal from the semiconductor driving circuit 112; and an alarm generating circuit 118 which generates an alarm depending on the presence/absence of a semiconductor safety check signal from the semiconductor disorder detecting circuit 117.

Onto the openings 104 of cover 103 of FIG. 1 there are attached two indicator LEDs 130: one shows its active state by lighting in response to a semiconductor driving signal from semiconductor driving circuit 112, while the other shows an alarming state by lighting depending on the presence/absence of a semiconductor safety check signal. To the alarm delivering terminals 106 of an alarm delivering circuit 118 are connected, as shown in FIG. 2, an external DC power supply 128, a relay 129 which is activated in response to a semiconductor safety check signal, a PLC, etc.

A semiconductor disorder detecting circuit 117 comprises a logic-based judging circuit 119 for delivering a logic-based judgement signal based on a semiconductor driving signal and an across-semiconductor voltage detecting signal; and a filtration circuit 120 for removing a logic-based judgement signal of noises and other disturbing elements, to thereby produce a semiconductor safety check signal.

Figure 3:
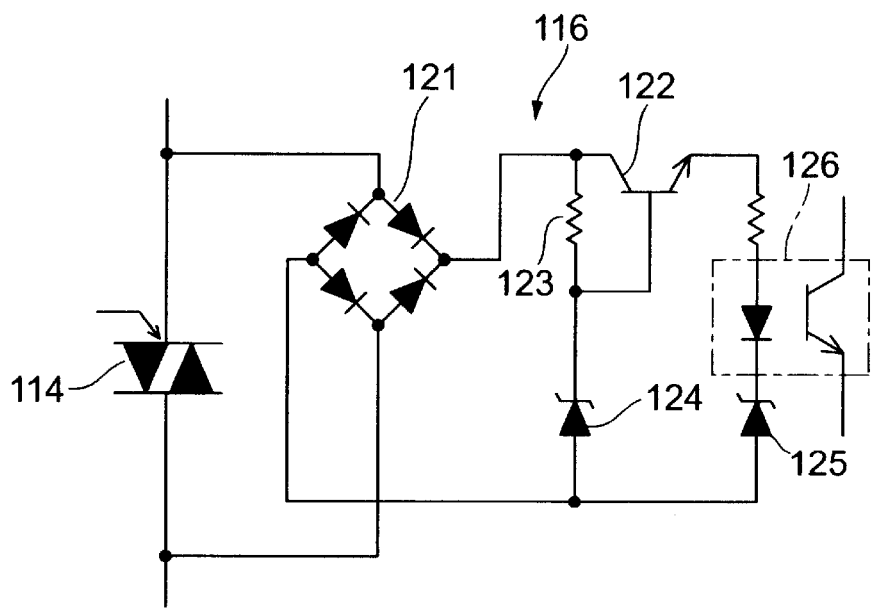
FIG. 3 illustrates the circuit components of an across-element voltage detecting circuit of the first embodiment.

The semiconductor disorder detecting circuit 116 comprises, as shown in FIG. 3, a diode bridge for rectifying current passing through triac 114; a transistor 122, a resistance 123, and a zener diode which are combined to keep the across-semiconductor voltage at a constant level, while preventing the generation of an excess current; another zener diode 125 by which one can determine a threshold for disorder detection; and a photo-coupler 126 which generates a high-level across-semiconductor detection signal when the voltage across triac 114, that is, the across-semiconductor voltage exceeds a predetermined detection threshold, while generating a low-level across-semiconductor detection signal when the across-semiconductor voltage remains below the detection threshold.

Figure 4:
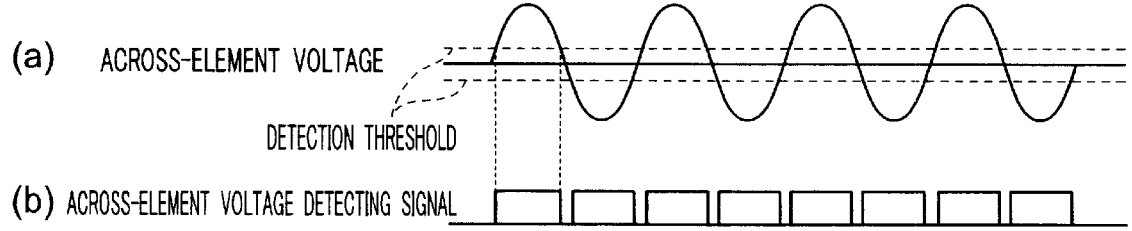
FIG. 4 shows signal wave traces representing the relationship between an across-element voltage and an across-element voltage detection signal when a triac related with the first embodiment is turned off.

FIGS. 4 and 5 give signal wave traces to show the relationship of the across-semiconductor voltage with the across-semiconductor voltage signal: FIG. 4 concerns a case where triac 114 is turned off while FIG. 5 a case where triac 114 is turned on.

With regard to the former case where triac 114 is turned off, a sine wave voltage as shown in FIG. 4(*a*) appears in correspondence with the voltage supplied by the load power supply circuit 109 as an across-semiconductor voltage; and for every interval at which the absolute value of the across-semiconductor voltage is above that of a detection threshold, a high-level across-semiconductor voltage detection signal with a predetermined width is generated as shown in FIG. 4(*b*) which is then delivered outside from the across-voltage detecting circuit 116.

With regard to the latter case where triac 114 is turned on, the across-semiconductor voltage is kept at about 1V or below the detection threshold as shown in FIG. 5(*a*), and then a low-level across-semiconductor voltage detection signal as shown in FIG. 5(*b*) is delivered outside from the across-semiconductor voltage detecting circuit 116.

The semiconductor driving circuit 112, on receipt of a control input signal from a control device 111, delivers a high-level semiconductor driving signal to the logic-based judgement circuit 119, whereas it delivers a low-level semiconductor driving signal to the logic-based judgement circuit 119, unless it receives a control input signal.

Next, the disorder judgement algorithm applied to the semiconductor disorder detecting circuit 117 will be described.

The semiconductor disorder detecting circuit 117 checks whether triac 114 is in disorder or not, based on an across-semiconductor voltage detection signal from the across-semiconductor voltage detecting circuit 116 and a semiconductor driving signal from the semiconductor driving circuit 112 in the manner as depicted in FIG. 6.

The semiconductor disorder detecting circuit 117, for example, when it receives a high level of semiconductor driving signal and a low level of across-semiconductor voltage, it judges triac 114 is normal because it is turned on with the semiconductor driving signal being at a high level, and it is kept normal with the across-semiconductor voltage being at a low level, as shown in FIG. 6.

The semiconductor disorder detecting circuit 117, for example, when it receives a high level of semiconductor driving signal and a high level of across-semiconductor voltage, it judges triac 114 is in disorder because it is turned on with the semiconductor driving signal being at a high level, but is kept off with the across-semiconductor voltage being at a low level, as shown in FIG. 6.

The semiconductor disorder detecting circuit 117, for example, when it receives a low level of semiconductor driving signal and a high level of across-semiconductor voltage, it judges triac 114 is normal because it is turned off with the semiconductor driving signal being at a low level, but is kept off with the across-semiconductor voltage being at a high level, as shown in FIG. 6.

The semiconductor disorder detecting circuit 117, for example, when it receives a low level of semiconductor driving signal and a high level of across-semiconductor voltage, it judges triac 114 is in disorder because it is turned off with the semiconductor driving signal being at a low level, but is kept on with the across-semiconductor voltage being at a low level, as shown in FIG. 6.

The processing algorithm applied to the logic-based judgement circuit 119 and filtration circuit 120 within the semiconductor disorder detecting circuit 117 will be then described.

The logic-based judgement circuit 119 of semiconductor disorder detecting circuit 117 obtains an exclusive logic sum of a semiconductor driving signal and an across-semiconductor voltage detection signal, and reveres the exclusive logic sum. The filtration circuit 120 basically flattens a logic-based judgement signal from logic-based judgement circuit 119 using a circuit with a CR-based time constant, and, when it finds the signal exceeds a predetermined threshold, it judges the semiconductor is in disorder and delivers a high level of semiconductor safety check signal.

Figure 8:
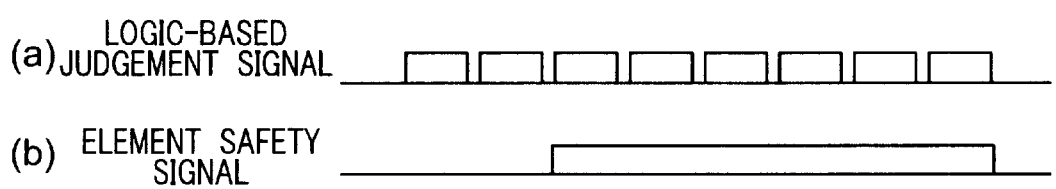
FIG. 8 shows signal wave traces representing a logic-based judgement signal and an element safety signal when the triac related with the first embodiment is wrongly turned off.
Figure 9:
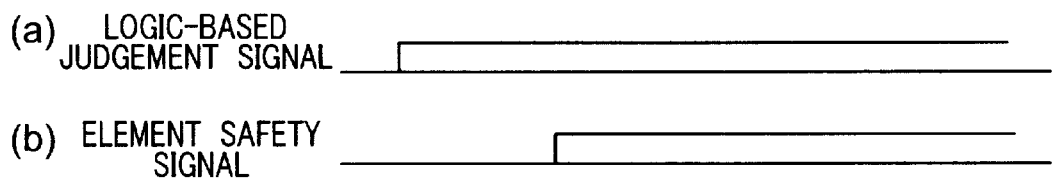
Figure 10:
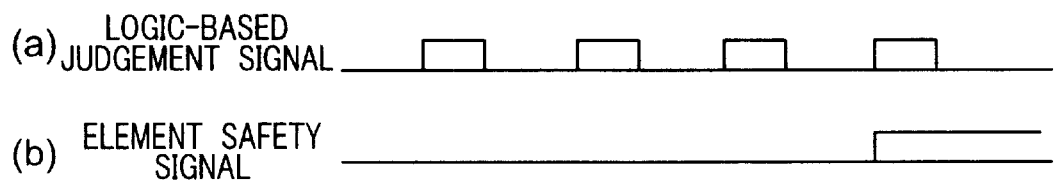
FIG. 10 shows signal wave traces representing a logic-based judgement signal and an element safety signal when the triac related with the first embodiment is wrongly turned on at every one half wave.

Then, the operation of the logic-based judging circuit 119 and the filtration circuit 120 will be described, taking, as an example, how they judge the semiconductor is in disorder based on the algorithm. FIGS. 7 to 10 give signal wave traces of the logic-based judgement signal from the logic-based judging circuit 119, and the semiconductor safety check signal from the filtration circuit 120: FIG. 7 gives the traces when triac 114 is rightly turned off; FIG. 8 the same when triac 114 is wrongly turned off; FIG. 9 the same when triac 114 is wrongly turned on; and FIG. 10 the same when triac 114 is wrongly on at each half wave.

When triac 114 is rightly turned off, the logic-based judging circuit 119 seeks an exclusive logic sum between a high level of across-semiconductor voltage detection signal with a predetermined pulse width as shown in FIG. 4(b) and a low level semiconductor driving signal, and reverses the result to produce a logic-based judgement signal with a small pulse width as shown in FIG. 7(a). Because the logic-based judgement signal has such a small width that it does not reach a predetermined threshold at the filtration circuit 120, which thus produces a low level of semiconductor safety check signal indicating triac 114 is normal, as shown in FIG. 7(b).

When triac 114 is wrongly turned off, the logic-based judging circuit 119 seeks an exclusive logic sum between a high level of across-semiconductor voltage detection signal with a predetermined pulse width as shown in FIG. 4(b) and a high level semiconductor driving signal, and reverses the result to produce a logic-based judgement signal with a predetermined pulse width as shown in FIG. 8(a). Then, the logic-based judgement signal has such a large width that it exceeds the predetermined threshold at the filtration circuit 120, which thus produces a high level of semiconductor safety check signal indicating triac 114 is in disorder, as shown in FIG. 7(b).

When triac 114 is wrongly turned on, the logic-based judging circuit 119 seeks an exclusive logic sum between a low level of across-semiconductor voltage detection signal as shown in FIG. 5 and a low level semiconductor driving signal, and reverses the result to produce a high level of logic-based judgement signal as shown in FIG. 9(a). Then, the logic-based judgement signal exceeds the predetermined threshold at the filtration circuit 120, which thus produces a high level of semiconductor safety check signal indicating triac 114 is in disorder, as shown in FIG. 9(b).

When triac 114 is wrongly turned on at each half wave, the logic-based judging circuit 119 delivers a logic-based judgement signal consisting of a train of pulses having a prolonged period with a predetermined, large width as shown in FIG. 10(a) indicating triac 114 is rightly turned off at each half wave. Because the pulse has such a large width that it exceeds a predetermined threshold at the filtration circuit 120, which thus produces a high level of semiconductor safety check signal indicating triac 114 is in disorder, as shown in FIG. 7(b).

The filter circuit, on receipt of a logic-based judgement signal having a predetermined duty ratio or higher, will produce a high level of semiconductor safety check signal.

Figure 11:
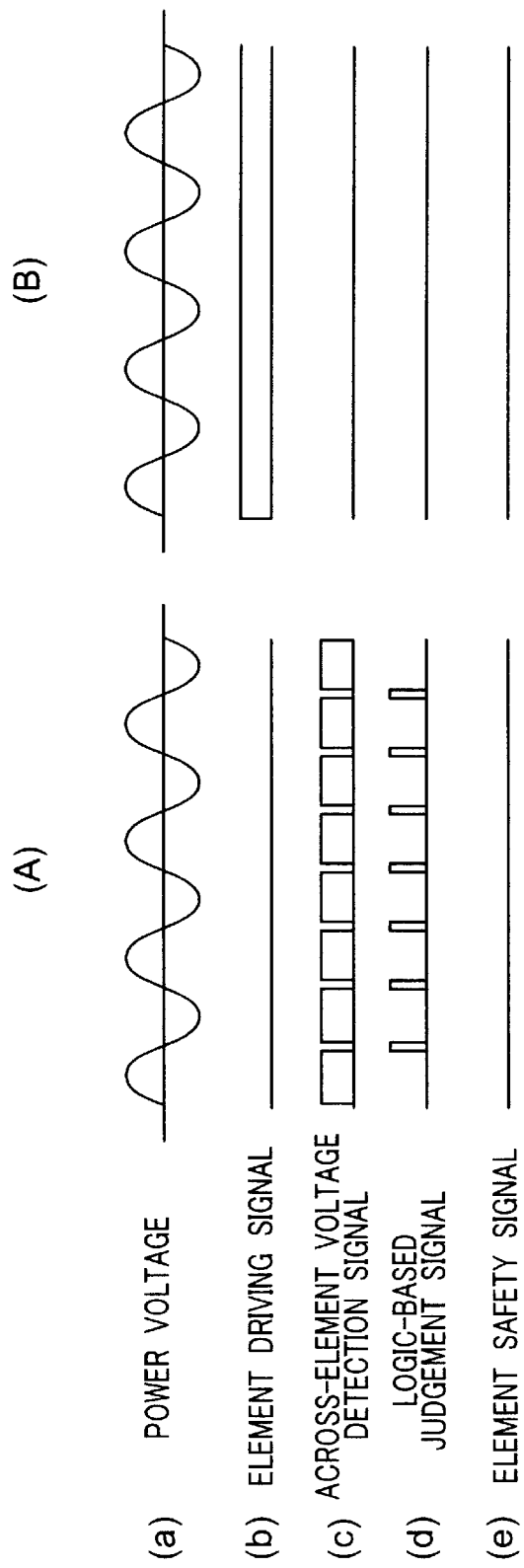
FIG. 11 shows signal wave traces representing a power voltage, element driving signal, across-element voltage detection signal, logic-based judgement signal and element safety signal, when the triac related with the first embodiment operates normally.

Now, how a disorder is detected according to the first embodiment of this invention will be detailed with reference to the signal wave traces of FIGS. 11 to 14. FIG. 11 gives the signal wave traces obtained when the semiconductor operates normally: FIG. 11(A) gives the signal wave traces when the system does not receive a control input signal; and FIG. 11(B) the same when the system receives a control input signal. In those figures, (a) represents the voltage of power supply; (b) semiconductor driving signal delivered by semiconductor driving circuit 112; (c) across-semiconductor voltage detection signal delivered by across-semiconductor voltage detecting circuit 116; (d) logic-based judgement signal delivered by logic-based judgement circuit 119; and (e) semiconductor safety check signal delivered by filtration circuit 120.

In FIG. 11(A), no control input signal is fed; the semiconductor driving signal delivered by the semiconductor driving circuit 112 is kept at a low level as shown in (b); and thus triac 114 is rightly turned off. The across-semiconductor voltage detecting circuit 116 delivers the across-semiconductor voltage detection signal consisting of a series of pulses with a predetermined width as shown in (c). Then, the logic-based judgement circuit 119 seeks an exclusive logic sum between the semiconductor driving signal and the across-semiconductor voltage signal, and reverses the result, thereby producing a logic-based judgement signal as shown in FIG. 11(d). Because the logic-based judgement signal has a small duty ratio, the filtration circuit 120 delivers a low level of semiconductor safety check signal indicating triac 114 is normal.

In FIG. 11(B), because a control input signal is fed, the semiconductor driving circuit 112 delivers a high level of semiconductor driving signal as shown in (b). Because then triac 114 is rightly turned on, the across-semiconductor voltage detecting circuit 116 delivers a low level of across-semiconductor voltage detection signal as shown in (c). In addition, the logic-based judgement circuit 119 seeks an exclusive logic sum between the semiconductor driving signal and the across-semiconductor voltage signal, and reverses the result, thereby producing a logic-based judgement signal as shown in FIG. 11(d). Then, the filtration circuit 120 delivers a low level of semiconductor safety check signal indicating triac 114 is normal.

Figure 12:
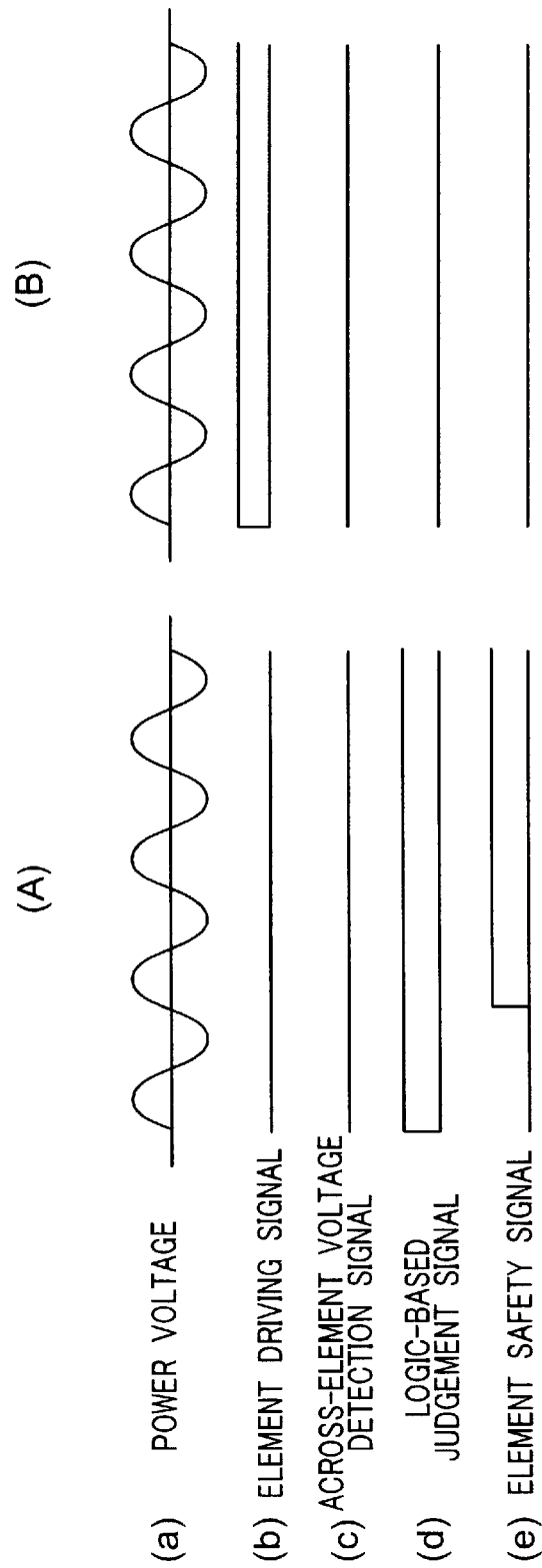

FIG. 12 shows signal wave traces when triac 114 is in disorder: FIG. 12(A) gives the signal wave traces when the system does not receive a control input signal; and FIG. 12(B) the same when the system receives a control input signal.

In FIG. 12(A), no control input signal is fed; the semiconductor driving circuit 112 delivers a low level of semiconductor driving signal as shown in (b); and in spite of this, triac 114 is wrongly turned on. Then, the across-semiconductor voltage detecting circuit 116 delivers a low level of across-semiconductor voltage detection signal as shown in (c). In addition, the logic-based judgement circuit 119 seeks an exclusive logic sum between the semiconductor driving signal and the across-semiconductor voltage signal, and reverses the result, thereby producing a high level of logic-based judgement signal as shown in FIG. 11(d). Then, the filtration circuit 120 delivers a high level of semiconductor safety check signal indicating triac 114 is in disorder.

In FIG. 12(B), when a control input signal is fed, the semiconductor driving circuit 112 delivers a high level of semiconductor driving signal as shown in (b), and then the system can not detect when triac 114 is wrongly turned on. This does not pose a problem, however, because, when a control input signal is not fed, the system can safely detect when triac 114 is wrongly turned on.

Figure 13:
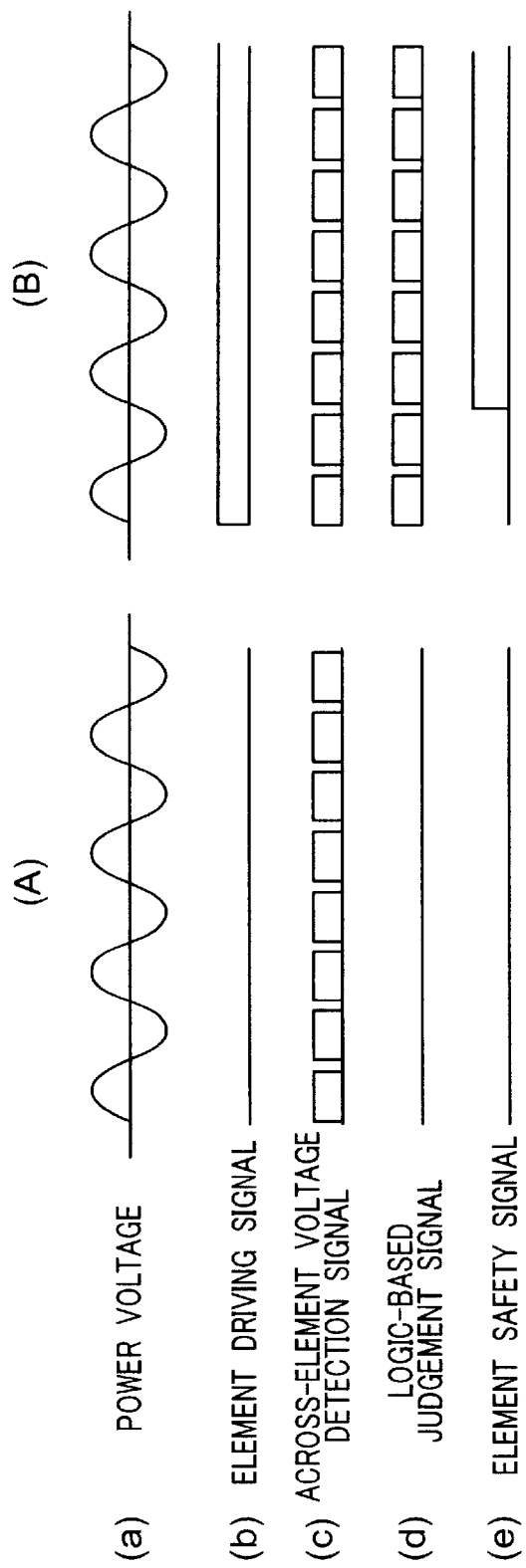
FIG. 13 shows signal wave traces representing a power voltage, element driving signal, across-element voltage detection signal, logic-based judgement signal and element safety signal, when the triac related with the first embodiment is wrongly turned off.

FIG. 13 gives signal wave traces when triac 114 is wrongly turned off: FIG. 13(A) gives the signal wave traces when the system does not receive a control input signal; and FIG. 13(B) the same when the system receives a control input signal.

In FIG. 13(B), a control input signal is fed; the semiconductor driving circuit 112 delivers a high level of semiconductor driving signal as shown in (b); and in spite of this, triac 114 is wrongly turned off. Thus, the across-semiconductor voltage detecting circuit 116 delivers the across-semiconductor voltage detection signal consisting of a series of pulses with a predetermined width as shown in (c). In addition, the logic-based judgement circuit 119 seeks an exclusive logic sum between the semiconductor driving signal and the across-semiconductor voltage signal, and reverses the result, thereby producing the logic-based judgement signal consisting of a series of pulses with a predetermined width as shown in FIG. 11(*d*). Then, the filtration circuit 120 delivers a high level of semiconductor safety check signal indicating triac 114 is in disorder.

In FIG. 13(A), no control input signal is fed; thus, the semiconductor driving circuit 112 delivers a low level of semiconductor driving signal as shown in (b), and then the system can not detect when triac 114 is wrongly turned off. This does not pose a problem, however, because, when a control input signal is fed, the system can safely detect when triac 114 is wrongly turned off.

Figure 14:
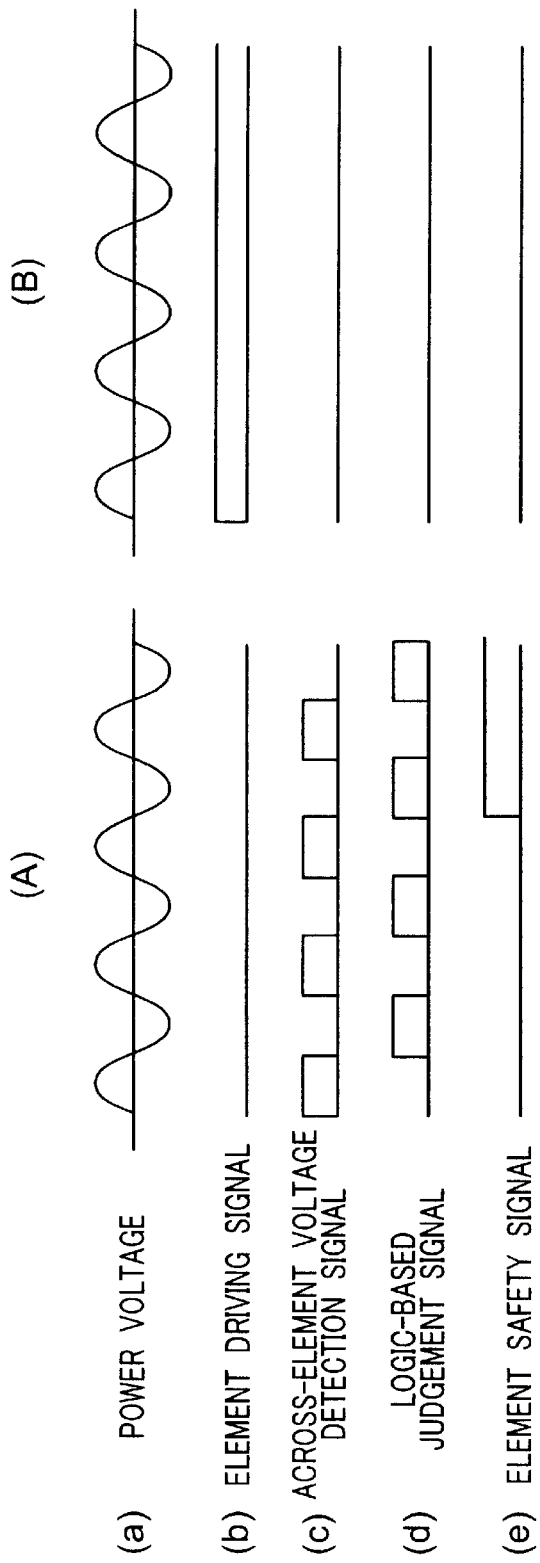
FIG. 14 shows signal wave traces representing a power voltage, element driving signal, across-element voltage detection signal, logic-based judgement signal and element safety signal, when the triac related with the first embodiment is wrongly turned on at every one half wave.
Figure 15:
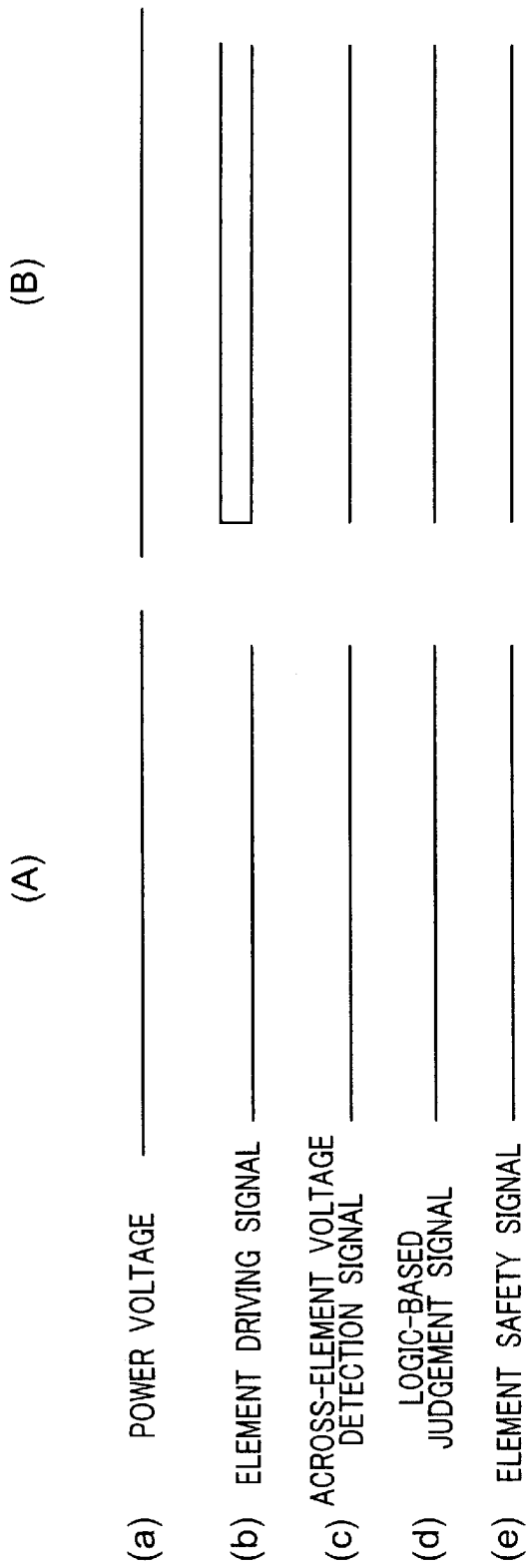
FIG. 15 shows signal wave traces representing a power voltage, element driving signal, across-element voltage detection signal, logic-based judgement signal and element safety signal, when power supply to the triac related with the first embodiment is discontinued.

FIG. 14 give signal wave traces when triac 114 is wrongly turned on at each half wave: FIG. 14(A) gives the signal wave traces when the system does not receive a control input signal; and FIG. 14(B) the same when the system receives a control input signal.

In FIG. 14(A), no control input signal is fed; the semiconductor driving circuit 112 delivers a low level of semiconductor driving signal as shown in (b); and in spite of this, triac 114 is wrongly turned on at each half wave. Thus, the across-semiconductor voltage detecting circuit 116 delivers the across-semiconductor voltage detection signal consisting of a series of pulses having a prolonged period with a predetermined width as shown in (c). In addition, the logic-based judgement circuit 119 seeks an exclusive logic sum between the semiconductor driving signal and the across-semiconductor voltage signal, and reverses the result, thereby producing the logic-based judgement signal consisting of a series of pulses having a prolonged period with a predetermined width as shown in FIG. 14(*d*). Then, the filtration circuit 120 delivers a high level of semiconductor safety check signal indicating triac 114 is in disorder as shown in FIG. 14(*e*).

In FIG. 14(B), a control input signal is fed; thus, the semiconductor driving circuit 112 delivers a high level of semiconductor driving signal as shown in (b), and then the system can not detect when triac 114 is wrongly turned on at each half wave. This does not pose a problem, however, because, when no control input signal is fed, the system can safely detect when triac 114 is wrongly turned on at each half wave.

According to this first embodiment, because it is determined whether triac 114 is normal or in disorder, by referring to the across-semiconductor voltage detection signal representing the voltage across triac 114, and the semiconductor driving signal generated in response to the control input signal, it is possible to reliably detect whether triac 114 is normal or in disorder, as well as to greatly reduce the size of the system as compared with the semiconductor relay system based on a CT (current transformation) type current sensor.

Further, according to the first embodiment, because the logic-based judging circuit 119 delivers a logic-based judgement signal depending on the presence/absence of an across-semiconductor voltage detection signal and of a semiconductor driving signal, and the filtration circuit 120 delivers a semiconductor safety check signal being removed of external disturbing elements such as noises and reflecting the presence/absence of disorder, it is possible to reliably detect the disorder of triac 114 if any, even to detect triac 114 being in disorder at every half wave.

Still further, according to the first embodiment, because the load power supplying circuit 109 responsible for the power supply of the across-semiconductor voltage detecting circuit 116 and the semiconductor disorder detecting circuit 117 which are both engaged in disorder detection have its power supplied by the power supply circuit 110 as shown in FIG. 2, the semiconductor element 115 has its power supply withdrawn, when a breaker 127 is disconnected, for example, on termination of the day's work, and thus power supply to the power supply circuit 110 is also withdrawn. Therefore, the system is safely prevented from making a blunder by judging the semiconductor is in disorder when power supply from the load power supplying circuit 109 to the semiconductor is withdrawn.

FIG. 5 give signal wave traces representing the voltage of power supply, semiconductor driving signal, across-semiconductor voltage detection signal, logic-based judgement signal, and semiconductor safety check signal, when the breaker 127 is disconnected. When power supply to the semiconductor element 115 is withdrawn, power supply to the power supply circuit 110 is also withdrawn. Therefore, the disorder detecting operation is arrested and thus the semiconductor safety check signal stays at a low level.

Figure 16:
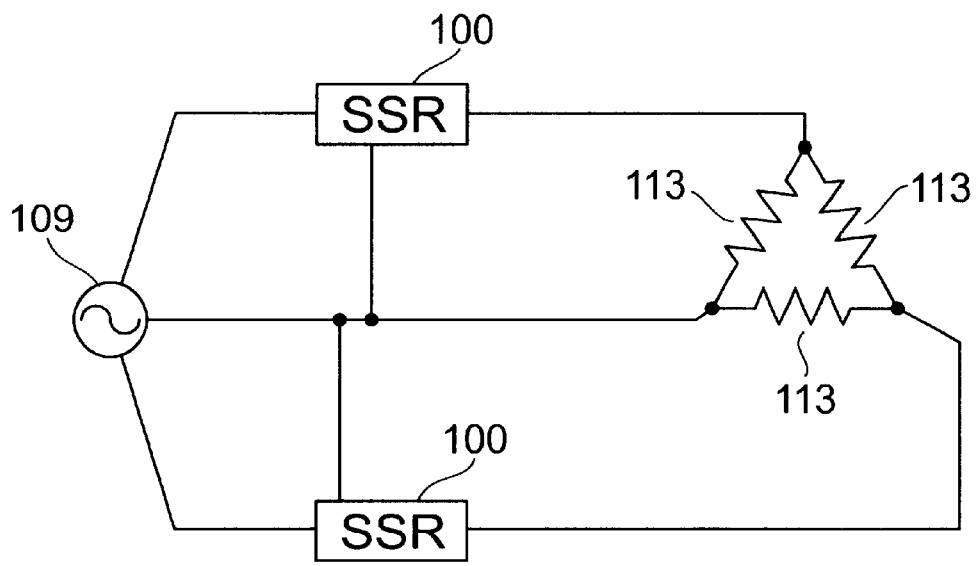
FIG. 16 illustrates a case where SSRs representing the first embodiments are connected to the three connectors of a delta-circuit.
Figure 17:
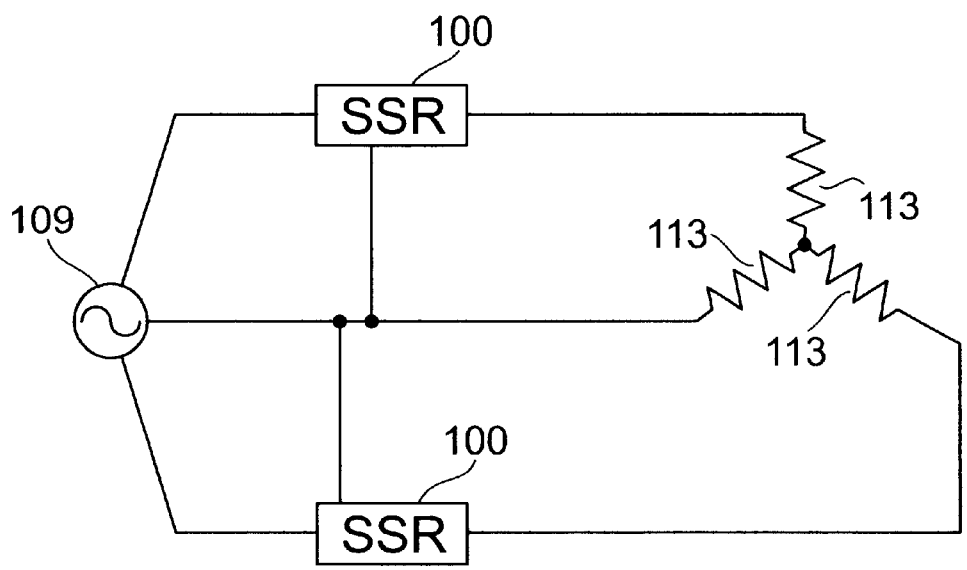
FIG. 17 illustrates a case where SSRs representing the first embodiments are connected to the three connectors of a star-circuit.

The above first embodiment has been described on the premise that a single SSR 100 active on a single phase is incorporated in the system. Needless to say, however, two SSRs 100 connected to a delta-circuit as indicated in FIG. 16 or to a star-circuit as indicated in FIG. 17 will ensure a similar advantage.

The above first embodiment has been described on the premise that the semiconductor element is represented by a triac 114. Needless to say, however, the system which incorporates, as the semiconductor element, a thyristor, or another output element, instead of a triac will ensure a similar advantage.

The first embodiment may incorporate a micro-computer for detecting a disorder in triac 114.

(Embodiment 2)

Next, a semiconductor relay system representing a second embodiment will be described.

The common relay system includes two types: one is based on an electromagnetic relay on its final stage; and the other on a semiconductor relay device containing a semiconductor element at its final stage.

The semiconductor relay system containing a semiconductor element at its final stage has a high responsivity and a long life, but can hardly avoid troubles resulting from shunting. Therefore, if the risk of its being exposed to shunting disorders is expected to be high, the device is always used in combination with an electromagnetic relay device.

This particularly holds true for the relay system used for securing safety, and for that purpose a relay system based on a semiconductor relay device alone has been regarded inadequate. Thus, a system for securing safety is usually based on a combination of a safety relay which is improved in reliability and an electromagnetic relay produced by a technique known in the prior art. In this context, a structure combining a semiconductor relay device and an electromagnetic relay device for improving its reliability has been proposed.

However, according to the relay system with the above structure, it is necessary for detecting a disorder in the semiconductor element to flow current through a disorder detecting circuit. Therefore, if the disorder of the semiconductor element portion consists of a shunt, and power switch is turned on without knowing it, the system might operate inadvertently, continue to operate indefinitely, or operate heedless of external control, and the failure would involve other components.

The semiconductor relay system shown as the second embodiment has been proposed in view of above situations, and aims at serving as a highly reliable system whereby it is possible to quickly detect a disorder in the semiconductor element portion, and to improve the safety of the device, thereby improving the safety of the entire system incorporating the device.

Figure 18:
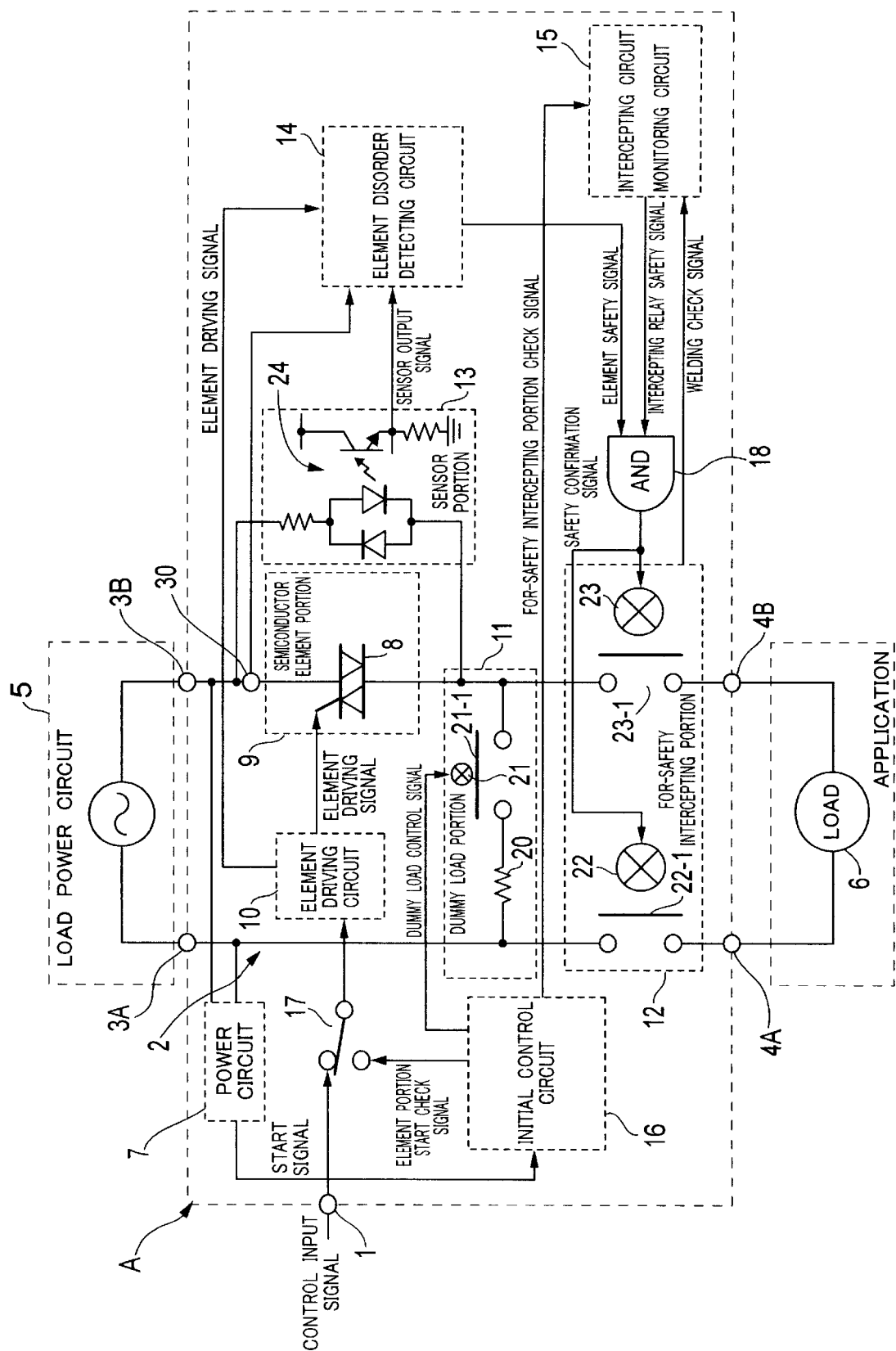
FIG. 18 is a block diagram to show the simplified structure of a semiconductor relay system representing a second embodiment of this invention.
Figure 19:
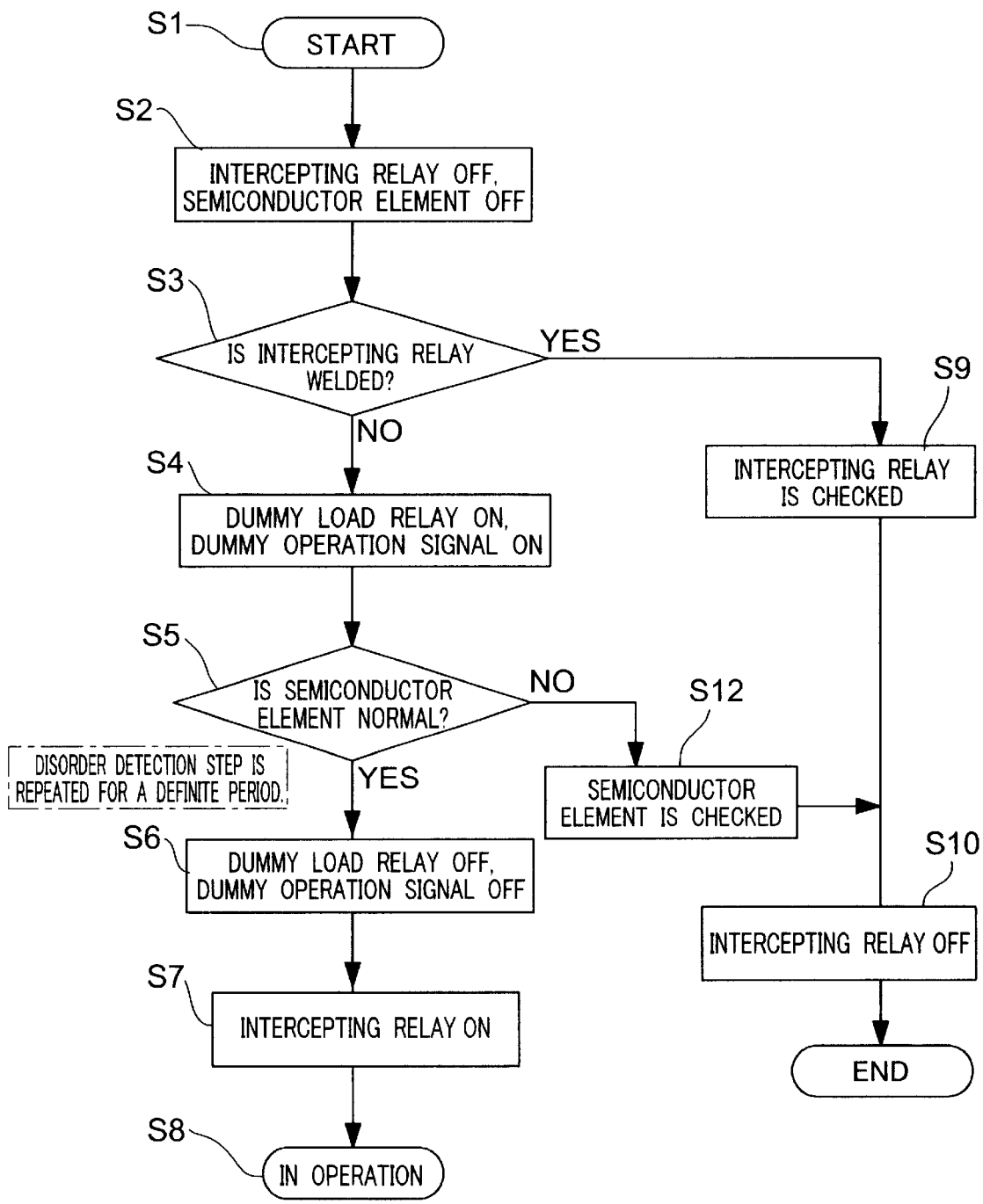
FIG. 19 is a flowchart of the steps required for the initiation of the semiconductor relay system.

FIG. 18 shows the simplified block diagram to show the internal structure of the semiconductor relay system representing the second embodiment, and FIG. 19 is a flowchart to show the booting steps of the semiconductor relay system.

The semiconductor relay system A comprises an input signal terminal 1, and input side terminals 3A, 3B and output side terminals 4A, 4B of load circuit 2, with the input side terminals 3A, 3B being connected to a load power circuit 5, while the output side terminals 4A, 4B being connected to a load 6.

The semiconductor relay system A comprises a power circuit 7, a semiconductor element portion 9, an element driving circuit 10, a dummy load portion 11, a for-safety intercepting portion 12, a sensor portion 13, an element disorder detecting circuit 14, a circuit interception monitoring circuit 15, an initial control circuit 16, and a logic circuit (AND circuit) 18.

The sensor portion 13, element disorder detecting circuit 14, circuit interception monitoring circuit 15, initial control circuit 16, and logic circuit (AND circuit) 18 constitutes a control circuit (control means). The power circuit 7 generates powers based on power supplied by the load power circuit 5 to distribute them to all individual circuits.

The semiconductor element portion 9 is constituted of a semiconductor element serving as a semiconductor relay (semiconductor switching element, for example, triac), and controls the load circuit 2 based on an element driving signal from the element driving circuit 10.

The semiconductor element portion 9 may comprise another semiconductor switching element instead of a triac, such as MOSFET, transistor, thyristor, GTO, etc.

The element driving circuit 10 generates an element driving signal for driving the semiconductor element 8 of semiconductor element portion 9, based on a control input signal. Its control works on a whole ON/whole OFF basis, unless a phase control signal is fed. To the input side of element driving circuit there is provided a switching portion 17 which allows, by switching, either a control input signal from outside or an element portion start checking signal from initial control circuit 16 to enter element driving circuit 10. The switching of switching portion 17 is controlled by initial control circuit 16.

The dummy load portion 11 is for insuring a current route necessary for the safety of the semiconductor element portion 9 when current passage through the load is intercepted, and comprises a resistance 20 to be connected in series with a relay contact 21-1 (normal open relay contact) of a dummy load relay 21 which is an electromagnetic relay. The dummy load portion 11 is connected to the load circuit 2 in parallel with load 6.

The for-safety intercepting portion 12 comprises relay contacts 22-1, 23-1 to be connected in series with two intercepting relays 22, 23 (normal open relay contacts) constituted of electromagnetic relays (forcibly guided safety relays). The for-safety intercepting portion 12 is connected to the load circuit 2 in parallel with load 6, and immediately intercepts load circuit 2 whenever the safety of the semiconductor element portion 9 (or of the system as a whole) can not be confirmed, and delivers a welding confirming signal indicating the welding of relays, to the intercepting circuit monitoring circuit 15.

The intercepting relays 22, 23 consisting of forcibly guided safety relays are a relay incorporated in a circuit for ensuring safety, and configured such that when any one of "a" contacts is welded, all the "b" contacts are turned off, while when any one of "b" contacts is welded, all the "a" contacts are turned off.

The sensor portion 13 is constituted of a photo-coupler 24 serving as a voltage detecting circuit and connected in parallel with the semiconductor element 8. This detects a voltage across the semiconductor element 8 and delivers a sensor output signal to the element disorder detecting circuit 14.

The element disorder detecting circuit 14 compares an element driving signal from the element driving circuit 10 with a sensor output signal from the sensor portion 13, and, when it confirms the system is safe (no failure as a result of shunting or opening is present), based on the comparison, it delivers an element safety check signal.

The intercepting circuit monitoring circuit 15 checks whether the for-safety intercepting portion 12 operates normally, based on a welding confirmation signal, and confirms its normality (for example, by confirming a pair of "b" points of relay contacts 22-1, 23-1 to be in contact with intercepting relays 22, 23 are safely closed), it delivers an intercepting relay safety signal. When it can not confirm the normal operation in question, it does not deliver any intercepting relay safety signal.

The initial control circuit 16, when power is turned on, delivers a dummy load control signal to the dummy load portion 11, thereby activating a dummy load relay 21 of dummy load portion 11 for a definite period, so that the safety of semiconductor element portion 9 can be checked. In this state, the same circuit intercepts the entry of a control input signal from outside, and delivers an element portion start check signal to the element driving circuit 10. Still further in this state, the same circuit delivers a for-safety interception check signal to the intercepting portion monitoring circuit 15, thereby causing the latter to check for the welding. The power circuit 7 delivers a start signal to the initial control circuit 16, in response to the entry of power.

The logic circuit 18 (AND circuit) is for delivering a safety confirmation signal to the for-safety intercepting portion 12, provided that an element safety signal delivered by the element disorder detecting circuit 14 and an intercepting relay safety signal delivered by the intercepting circuit monitoring circuit 15 are delivered concurrently (the two signals are at a high level).

Next, the semiconductor relay system A configured as above will be described with reference to the flowchart of FIG. 19 and the time chart of FIG. 21.

In an initial state, the semiconductor element 8, the relay contacts 21-1 of the dummy load relay 21 of dummy load portion 11, and the two relay contacts 22-1, 23-1 of the intercepting relays 22, 23 of for-safety intercepting portion 12 are all kept off.

When power is supplied to the power circuit 7, a start signal is delivered by the power circuit 7 to the initial control circuit 16 (step S1, step S2). The initial control circuit 16 controls the switching portion in such a way as to prevent a control signal from outside from entering; to cause a for-safety intercepting portion check signal to be delivered to the intercepting circuit monitoring circuit 15; and to cause the for-safety intercepting portion 12 to be checked for the welding of the two intercepting relays 22, 23 (step S3).

The intercepting circuit monitoring circuit 15 checks whether the for-safety intercepting portion is normally operable (whether the welding does not occur)(step S3), and when the for-safety intercepting portion is found to be normally operable, the initial control circuit 16 delivers a dummy load control signal to the dummy load portion 11, thereby activating the dummy load relay 21 of dummy load portion 11, so as to put the relay contact 21-1 into action for a definite period, and to thereby form a loop consisting of the load power portion 5, semiconductor element portion 9 and dummy load portion 11 (step S4).

The initial control circuit 16 delivers an element portion start check signal to the element driving circuit 10; the element driving circuit 10 generates an element driving signal; and the element driving signal is fed to the semiconductor element portion 9, thereby driving the semiconductor element. Because of this, a loop consisting of the load power portion 5, semiconductor element portion 9 and dummy load portion 11 is formed and current flows through the loop depending on the ON/OFF of the semiconductor element 8.

The sensor portion 13 detects an across-element voltage across the semiconductor element 8 of semiconductor element portion 9, and delivers a sensor output signal (across-element voltage detection signal) to the element disorder detecting circuit 14. The element driving circuit 10 delivers an element driving signal to the element disorder detecting circuit 14. Accordingly, the element disorder detecting circuit 14 checks based on the sensor output signal and the element driving signal whether the semiconductor element 8 operates normally (step S5).

When the element disorder detecting circuit 14 finds the semiconductor element operates normally, after a definite period, the initial control circuit 16 intercepts the entry of a dummy load control signal to the dummy load portion 11, thereby causing the relay contact 21-1 of the dummy load relay 21 of dummy load portion 11 to be switched off, and operates the switching portion 17 in accordance therewith (step S6).

The element disorder detecting circuit 14, when it finds the semiconductor element 8 is in a state indicating its normal operation, delivers an element safety signal. The intercepting circuit monitoring circuit 15, when it finds the intercepting circuit is in a state capable of achieving a normal function (when no welding occurs)(for example, by confirming "b" points which are paired with relay contacts 22-1, 23-1 of intercepting relays 22, 23 are safely closed), delivers an intercepting relay safety signal.

Both of the element safety signal and the intercepting relay safety signal are fed to the logic circuit 18 (AND circuit). When the two signals are at a high level, the logic circuit 18 (AND circuit) delivers a safety confirmation signal to the for-safety intercepting portion 12. Then, the relay contacts 22-1, 23-1 of intercepting relays 22, 23 are switched on, thereby allowing a control signal from outside to enter the element driving circuit 10, and the load circuit 2 to be activated, so as to run the entire system (step S7, step S8).

At step S3, if the for-safety intercepting portion is not found to operate normally (when the welding of contacts occurs)(step S9), the disorder is detected by the intercepting circuit monitoring circuit 15, which withdraws the delivery of an intercepting relay safety signal, and informs of the disorder, for example, by generating an alarming sound, and then causes the operation to be discontinued (step S10).

At step S5, if the semiconductor element portion 9 is in disorder, the sensor portion will not deliver a sensor output signal to the element disorder detecting circuit 14. Because of this, the element disorder detecting circuit determines the semiconductor element portion 9 does not operate normally (step S12), and then the intercepting circuit monitoring portion withdraws the delivery of an intercepting relay safety signal. Because of this, the relay contacts 22-1, 23-1 of the intercepting relays 22, 23 of for-safety intercepting portion 12 remain to be switched off, and operation is arrested (step S10).

Next, how the system operates when a disorder such as interrupted connection or shunting intervenes will be described with reference to the flowchart of FIG. 20 and the time charts of FIGS. 21 and 22.

Figure 20:
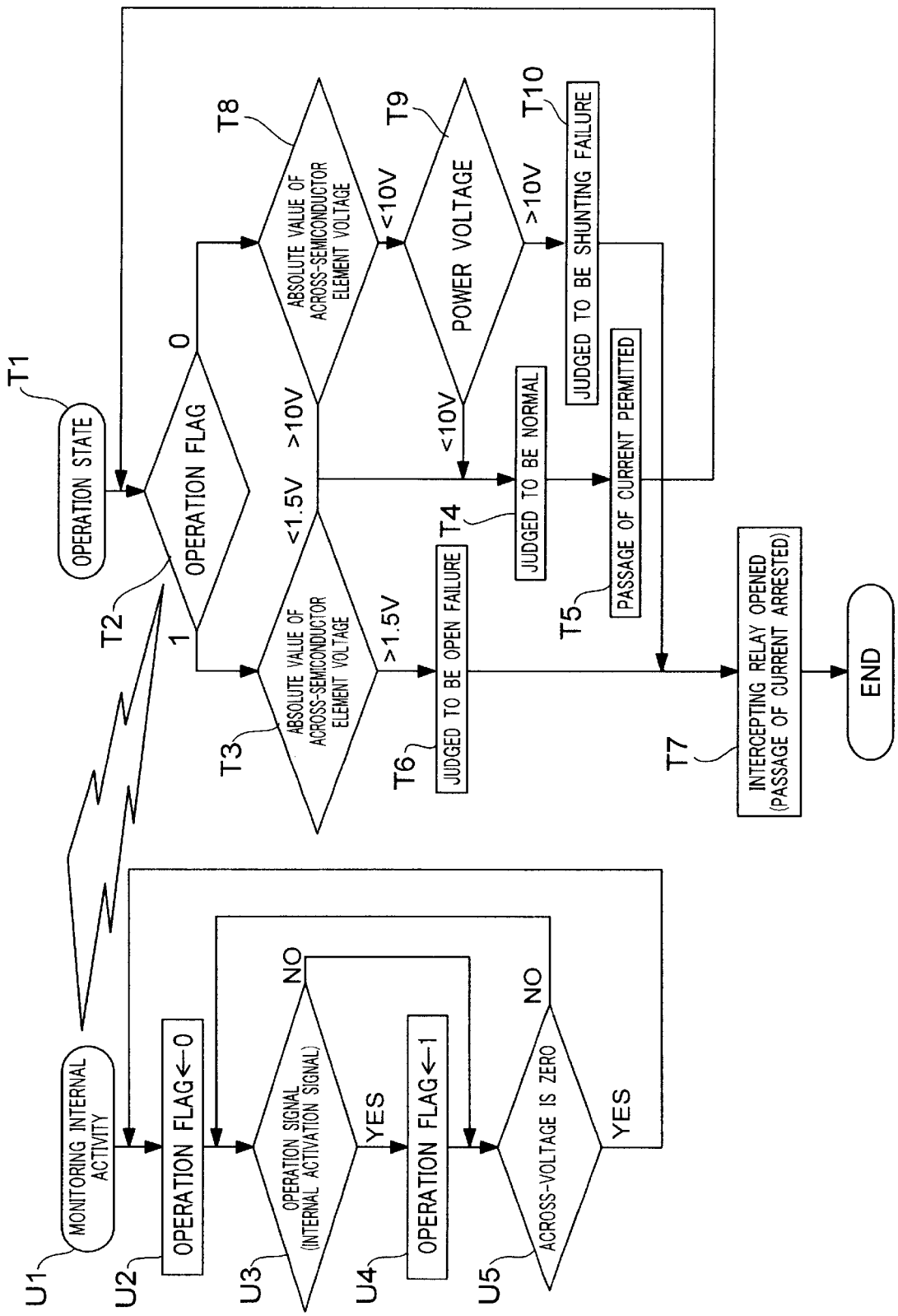
FIG. 20 is a flowchart of the steps required for the continuous operation of the semiconductor relay system.

The system monitors the ON/OFF state of the semiconductor element 9 during operation as indicated in steps U1 to U5 of the flowchart of FIG. 20. Let's assume the semiconductor element 8 is a triac in this particular embodiment. To monitor the operation of the element, it is necessary to check the internal activation state of the element. Let's assume operation flag 1 represents the ON state of the semiconductor element 8, while operation flag 0 represents the OFF state of the same element.

During operation (step T1), when the semiconductor element 8 is ON (operation flag 1), and the absolute value of voltage across the semiconductor element 8 is below 1.5V, wire interruption does not occur, and the element is determined to operate normally (steps T2, T3 and T4); permission is given for the passage of current (step T5); and operation is continued.

At step T3, if the absolute value of voltage across the semiconductor element 8 is larger than 1.5V, the system determines wire interruption occurs (step T6); the intercepting relays 22, 23 of for-safety intercepting portion 12 are opened; and passage of current through the load circuit 2 is discontinued (step T7).

Figure 21:
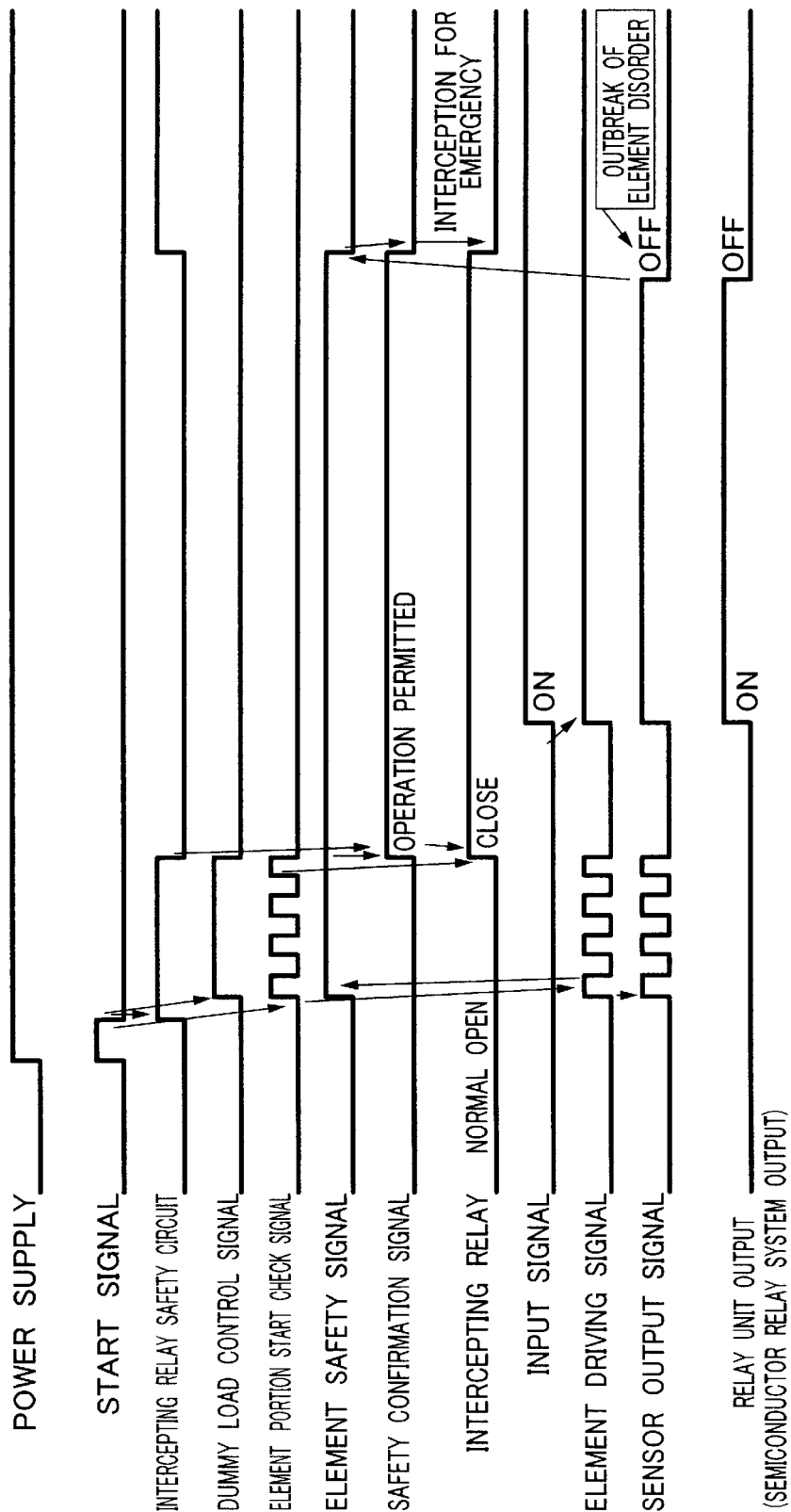

If wire interruption occurs during operation as described above, the sensor output signal falls to a low level as indicated by the time chart of FIG. 21. Even in such a case, the control input signal (driving signal) still keeps a high level. In this state, the element safety signal falls to a low level. Accordingly, even if both the element safety signal which is at a low level and the intercepting relay safety signal which is at a high level are fed to the AND circuit 18, no safety confirmation signal is delivered by the AND circuit 18. Thus, in the for-safety intercepting portion, the relay contacts 22-1, 23-1 of the intercepting relays 22, 23 are switched off, and operation of the load circuit 2 is discontinued.

During operation (step T1), when the semiconductor element 8 is at OFF (operation flag 0), and the absolute value of voltage across the semiconductor element 8 is larger than 10V, shunting failure does not occur, and operation is determined to be normal (step T8, step T4); permission for the passage of current is given (step T5); and operation is continued.

At step T8, when the absolute value of voltage across the semiconductor element 8 is below 10V, and the power voltage is below 10V, shunting failure does not occur, and the element is determined to be normal (step T8, step T9, step T4); permission is given for the passage of current; and operation is continued.

At step T8, if the absolute value of voltage across the semiconductor element 8 is below 10V, and the power voltage is larger than 10V, shunting failure occurs, and the element is determined to be abnormal (step T10); the intercepting relays of for-safety intercepting portion 12 are opened; passage of current through the load circuit 2 is withdrawn; and operation is discontinued (step T7).

Figure 22:
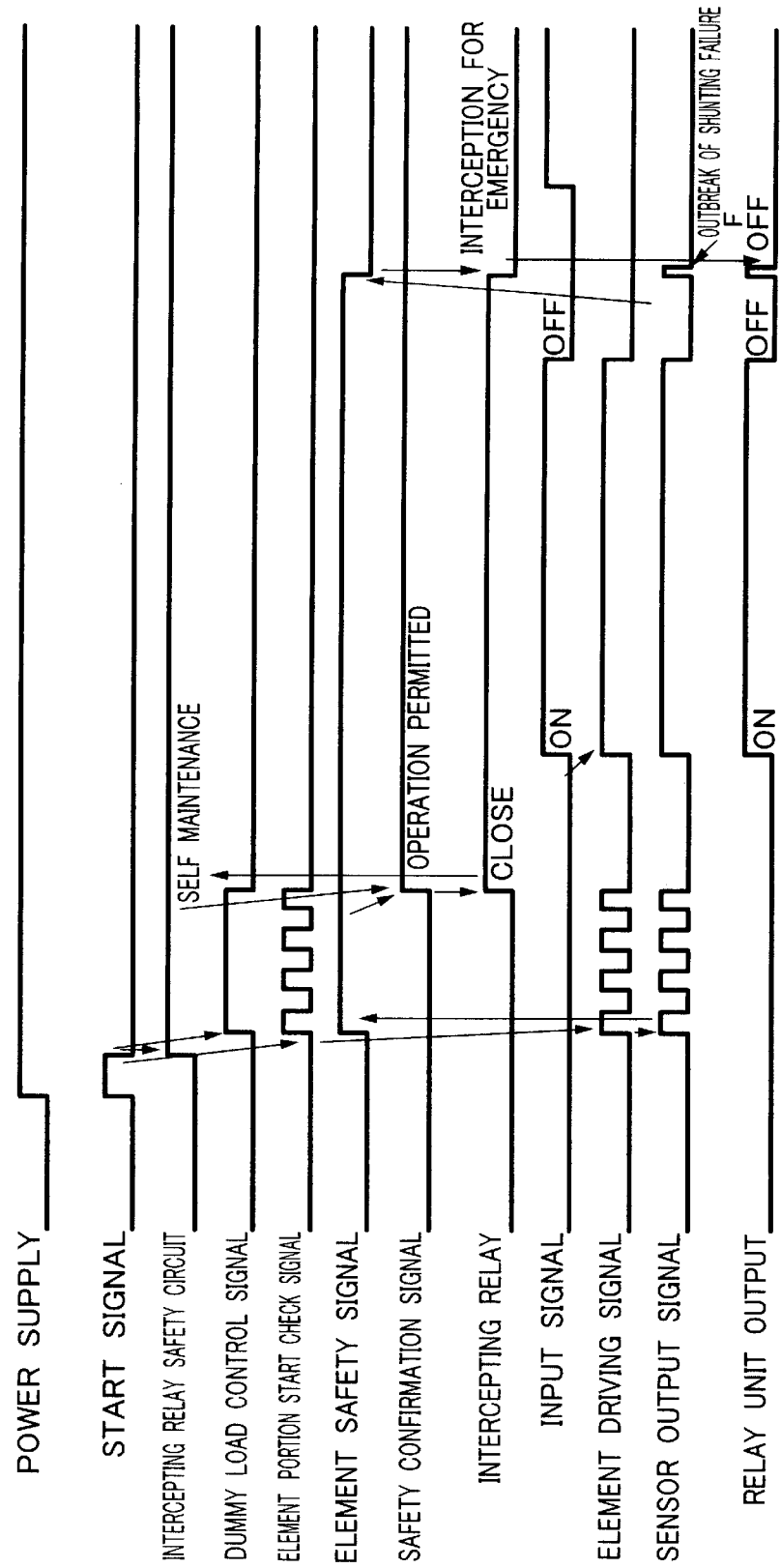

If shunting occurs during operation as described above, both the control input signal (driving signal) and the sensor output signal fall to a low level, and the sensor output signal then appears as a high level signal F as indicated by the time chart of FIG. 22. Because of the latter, the element safety signal staying at a high level falls to a low level. Accordingly, even if both the element safety signal which is now at a low level and the intercepting relay safety signal which is at a high level are fed to the AND circuit 18, no safety confirmation signal is delivered by the AND circuit 18. Thus, in the for-safety intercepting portion, the relay contacts 22-1, 23-1 of the intercepting relays 22, 23 are switched off, and operation of the load circuit 2 is discontinued.

Then, a method for controlling the semiconductor relay system of the second embodiment will be described with reference to FIG. 23 where different states of the system appearing with the progress of control are depicted.

Under a no power supply state (initial state), the semiconductor element 8 of semiconductor element portion 9, the relay contact 21-1 of the dummy load relay 21 of dummy load portion 11, and relay contacts 22-1, 23-1 of the intercepting relays 22, 23 of for-safety intercepting portion 12 are all witched off (step W1).

When power is supplied, an initial check state sets in (step W2), and the intercepting relays 22, 23 are checked for their normality, and the dummy load portion 21 is activated to check the semiconductor element portion 9 for its normality. If the intercepting relays 22, 23, and the semiconductor element portion 9 are found to be normal based on the check results, the relay contacts 22-1, 23-1 of intercepting relays 22, 23 are switched on, and the semiconductor element portion is activated, thereby initiating an operation state (step W3).

Figure 23:
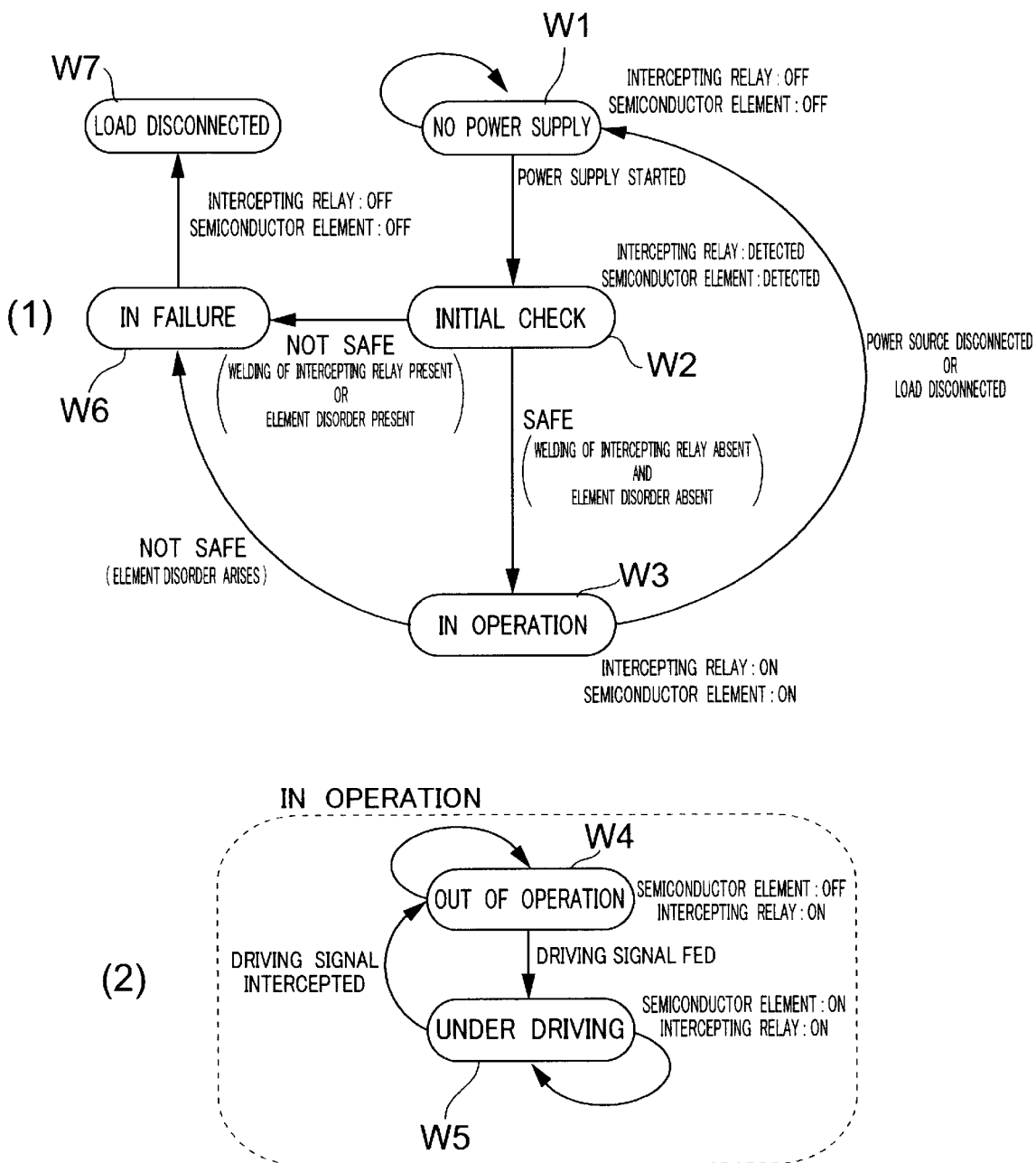
FIGS. 23(1) and 23(2) illustrate how control is achieved in the semiconductor relay system.

The operation state may be derived from an arrested state as shown in FIG. 23-(2): the system in an arrested state (step W4) receives a driving signal to turn into an operation state (step W5). The system in an operation state may turn into an arrested state (step W4), being deprived of the supply of a driving signal. The system in an operation state may turn into a no power supply state (initial state), being deprived of the load or the supply of power.

In an initial check state (step W2), if the relay contacts 22-1, 23-1 of intercepting relays 22, 23 are determined to be welded based on the detection result, passage of current through the dummy load 11 is not permitted, and disorder detection of the semiconductor element portion 9 is discontinued.

In a disorder state where the semiconductor element portion 9 is in disorder (step W6), the relay contacts 22-1, 23-1 of intercepting relays are switched off; the semiconductor element portion 9 is arrested; and operation of the load is discontinued (step W7).

In an operation state (step W3), if a disorder arises in the semiconductor element portion 9, passage of current through the load portion 11 is discontinued, and a disorder state sets in (step W6); the relay contacts 22-1, 23-1 of intercepting relays are switched off; and control is introduced such that the semiconductor element portion 9 is put to OFF, and kept from operation (step W7).

According to the second embodiment, it is possible to quickly detect the disorder of semiconductor element 8, thereby improving the safety of the system. It is possible to further enhance the safety of the system at large because the system does not permit the entry of a driving signal until it checks the safety of the entire system.

Further, because the sensor portion can detect the degradation of properties of the semiconductor element 8, the system can intercept the load circuit 2 via the for-safety intercepting circuit 12 before the system falls to a complete failure, or can direct, by delivering an alarm, the attention of the operator to a disorder to urge him to arrest the system before the system falls to a dangerous state. This will result in the further improvement of the safety of the system.

Figure 24:
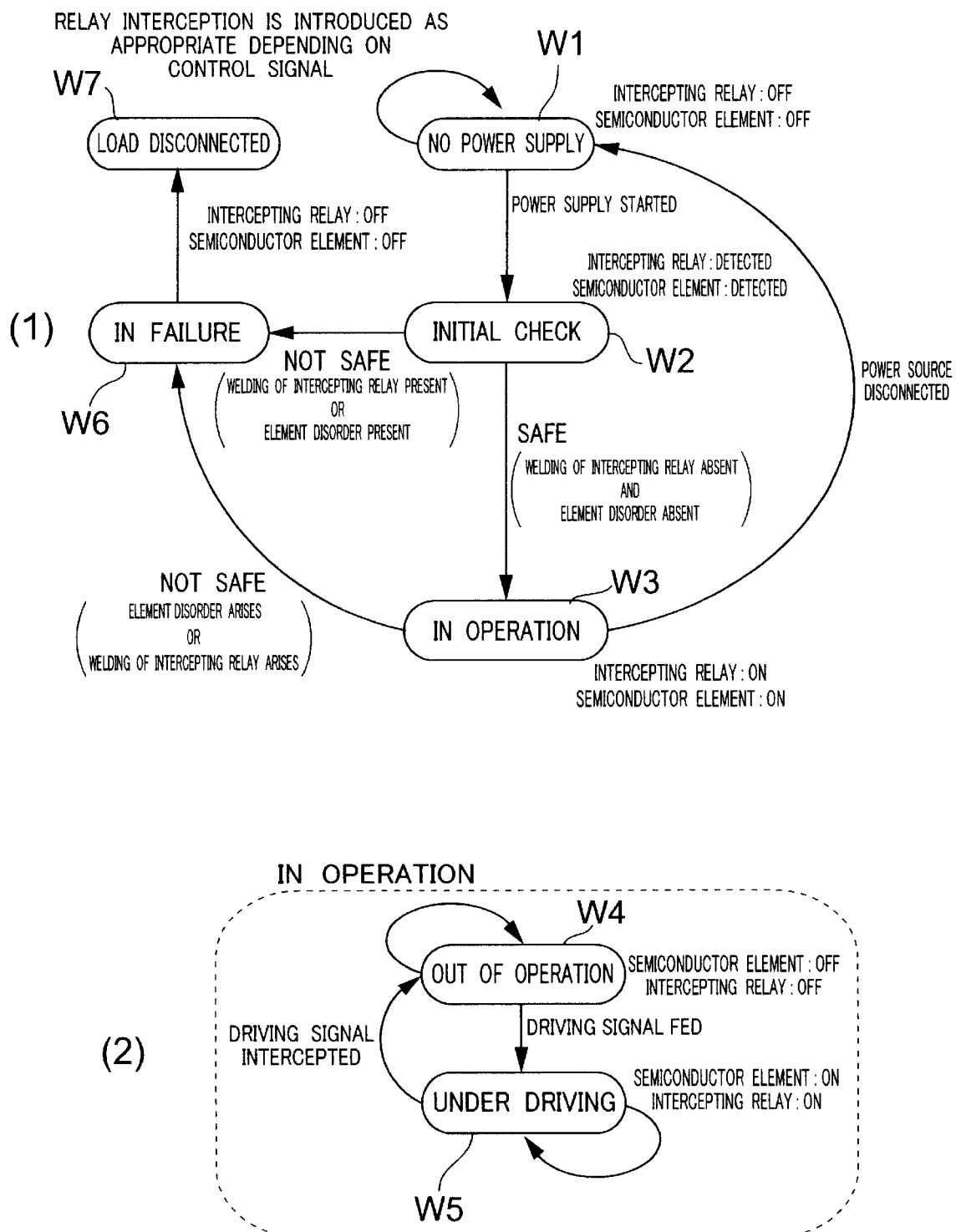
FIGS. 24(1) and 24(2) illustrate how control is achieved in the semiconductor relay system.

The method for controlling the semiconductor relay system representing the second embodiment comprises controlling the intercepting relays 22, 23 of for-safety intercepting portion 12 at any time as needed based on an element driving signal fed to the semiconductor element portion 9, as indicated by FIGS. 24(1) and 24(2) where different states the system takes in the process of control are depicted.

An operation state may be derived from an arrested state as shown in FIG. 24-(2): the system in an arrested state (step W4) where the semiconductor element portion 9 and intercepting relays 22, 23 are turned off receives a driving signal to turn into an operation state (step W5). In an operation state, the semiconductor element portion 9 and intercepting relays 22, 23 are turned on. The system in an operation state may turn into an arrested state, being deprived of the supply of a driving signal. The system in an operation state may turn into a no power supply state (initial state), being deprived of the load or the supply of power. Other controls are the same with those that have been described with reference to FIGS. 23(1) and 23(2).

According to the control action as depicted in FIG. 24, it is possible to turn off as needed the intercepting relay, thereby reliably discontinuing the operation of the system, which leads to the improved safety of the system.

The second embodiment has been described on the premise that the intercepting relays 22, 23 of for-safety intercepting portion 12 consist of a safety relay. However, the for-safety intercepting portion 12 may comprise a safety relay, or an electromagnetic relay having at least one contact which is normally kept open, or of a combination of a safety relay and a common relay, or of a semiconductor element having a high voltage tolerance.

According to the second embodiment, the dummy load portion 11 comprises a resistance 20 and the relay contact 21-1 of dummy load relay which is an electromagnetic relay connected in series. However, the resistance may be substituted for a resistance through which only a feeble current (for example, one tenth (1/10) of the load current) is allowed to pass.

Further, the dummy load relay 21 of dummy load portion 11 may comprise a "b" contact of the same safety relay with that used in the for-safety intercepting circuit 12.

Each of the sensor portion 13 and the element disorder detecting circuit 14 may be paired so that for each of them, if one pair is broken, the other can be readily introduced to insure normal operation. This will improve the fault tolerance of the system.

In the second embodiment, the semiconductor relay system A operates on a phase control basis. However, it may operate on a cycle control basis.

In the second embodiment, the semiconductor relay system may be configured such that the for-safety intercepting portion 12 can be forcibly opened in response to a safety control signal from outside. Further, the semiconductor relay system may have a function to deliver a safety control signal to outside, and a function to withdraw the delivery of the signal, when it detects a disorder in its interior.

Figure 25:
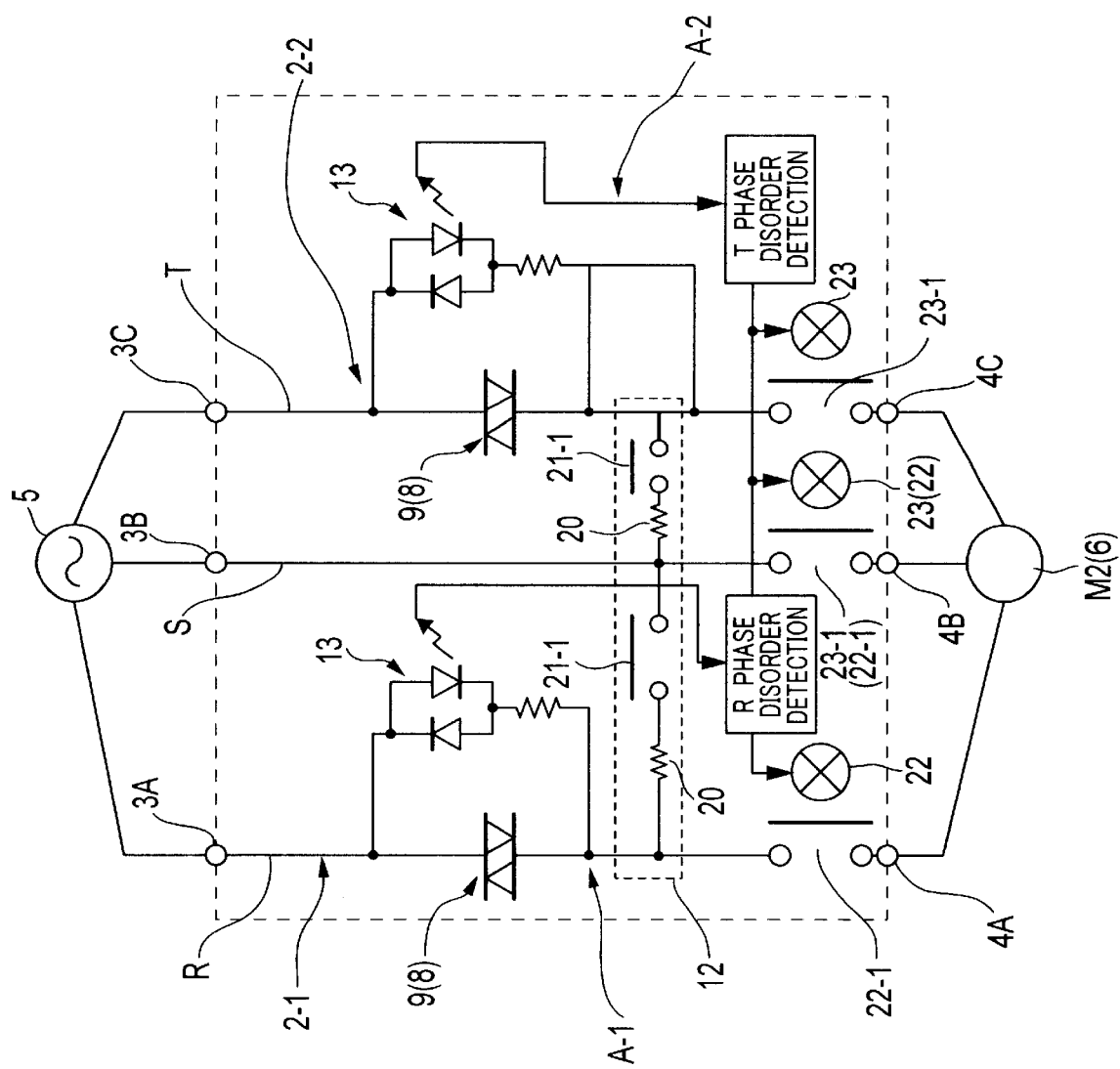
FIG. 25 is a circuit diagram to show a case where the semiconductor relay system is used in a circuit for driving a three phase motor.

FIG. 25 shows a case where the semiconductor relay system is incorporated in a circuit for controlling a three phase motor M2.

In this case, the load circuit consists of two parts: one is a load circuit 2-1 and the other a load circuit 2-2. The load circuit 2-1 comprises load wires R and S; and the load circuit 2-2 load wires S and T. Input side terminals 3A, 3B, 3C to load wires R, S, T are connected to a load power circuit 5, while output side terminals 4A, 4B, 4C to load wires R, S, T are connected to a three phase motor M2.

In the load circuit 2-1 is installed a semiconductor relay system A-1, while a semiconductor relay system A-2 is installed in the load circuit 2-2. For a for-safety intercepting portion 12 related with semiconductor relay system A-1, the relay contacts 22-1, 23-1 of intercepting relays 22, 23 are placed on load wires R, S. For the for-safety intercepting portion 12 related with semiconductor relay system A-2, the relay contacts 22-1, 23-1 of intercepting relays 22, 23 are placed on load wires S, T. The other configuration of each of the semiconductor relay systems A-1 and A-2 is the same with that of the above described semiconductor relay system A.

The basic algorithm underlying this system is: if the semiconductor element 8 is ON (internal activation is ON), and voltage across the element is present, the element suffers open failure, while if the semiconductor element 8 is OFF (internal activation is OFF), and voltage across the element is absent, the element suffers shunting failure.

The algorithm based on mode 1 voltage detection comprises checking for every half wave by masking the element. On mode 2 voltage detection, the system keeps watching voltage across the element, and when it detects a voltage below a predetermined value, it determines the element is shunted.

If the system detects a failure, it disconnects, out of three load wires R, S, T, two or three wires via a for-safety intercepting portion 12. Even if one of the three wires is welded, power supply will be safely intercepted.

For either of the semiconductor relay systems A, A-1 and A-3, the sensor portion 13 may comprise a current detecting circuit for detecting current flowing through the semiconductor element 8. The current detecting circuit may comprise a current detecting device (current detecting circuit) CT30 placed on load wires as shown in FIG. 18, and a sensor output from CT30 is delivered to an element disorder detecting circuit 14.

Figure 26:
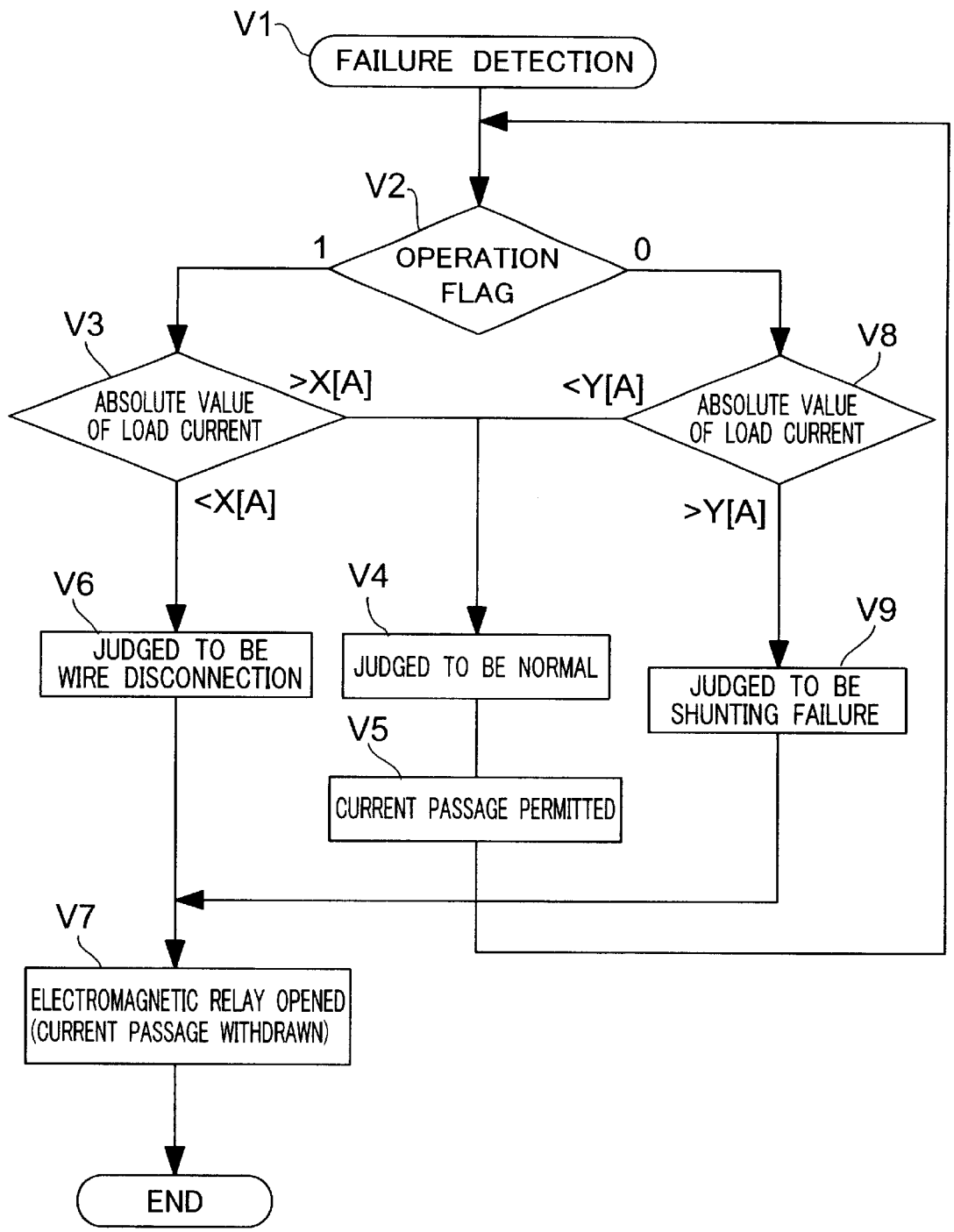
FIG. 26 is a flowchart of the steps necessary for detecting a disorder when the semiconductor relay system incorporates a current detecting circuit in its sensor portion.

In a disorder detection state as shown in FIG. 26 (step V1), if the semiconductor element 8 is at ON (operation flag is 1), and the absolute value of load current passing through the semiconductor element 8 is larger than a certain current value X[A], opening failure does not occur, and the element is determined to be normal (steps V2, V3, V4); and permission is given for the passage of current.

At step V3, if the absolute value of current passing through the semiconductor element 8 is smaller than the current value X[A], the element is determined to suffer an opening failure (step V6); the intercepting relays 22, 23 of for-safety intercepting portion 12 are opened; passage of current through the load circuit 2 is arrested; and operation is discontinued (step V7).

In a disorder state (step V1), if the semiconductor element 8 is at OFF (operation flag is 0), and the absolute value of current passing through the semiconductor element 8 is smaller than a certain value Y[A], shunting failure does not occur, and the element is determined to be normal (steps V8, V4); and permission is given for the passage of current through the element (step V5).

At step V8, if the absolute value of current passing through the semiconductor element 8 is larger than the value Y[A], shunting failure occurs, and the element is determined to be abnormal (step V9); the intercepting relays 22, 23 of for-safety intercepting portion 12 are opened; passage of current through the load circuit 2 is arrested; and operation is discontinued (step V7).

According to the semiconductor relay system of this invention configured as above, it is possible to reliably detect the disorder of semiconductor element portion, because the system determines whether the semiconductor element portion is in disorder or not, based on a sensor output signal from the sensor portion responsible for the monitoring of the semiconductor element portion and an element driving signal responsible for the activation of the semiconductor element portion.

According to the semiconductor relay system of this invention, because it is determined whether the semiconductor element portion is in disorder or not, by referring to the across-element voltage detection signal representing the voltage across the semiconductor element portion, it is possible to reliably detect the disorder, if any, of the semiconductor element portion. Moreover, use of the across-element voltage detecting circuit makes it possible to greatly reduce the size of the system as compared with the semiconductor relay system based on a CT (current transformation) type current sensor.

Further, according to the semiconductor relay system of this invention, because the logic-based judging circuit delivers a logic-based judgement signal depending on the presence/absence of an across-element voltage detection signal in accordance with ON/OFF state of the semiconductor element portion and on the presence/absence of a semiconductor driving signal, and an element safety signal indicative of the presence/absence of the disorder of the semiconductor element portion is delivered after being removed of external disturbing elements such as noises, it is possible to reliably deliver an element safety signal.

According to the semiconductor relay system, because power supply to the across-element voltage detecting circuit and to the element disorder detecting circuit is withdrawn when power supply from the load power circuit is discontinued, it is possible to safely prevent the across-element voltage detecting circuit and the element disorder detecting circuit from making a blunder by judging the semiconductor element portion is in disorder when power supply from the load power circuit is discontinued.

According to the semiconductor relay system of this invention, because it is possible to quickly detect a disorder in the semiconductor element portion, it is possible to improve the safety of the device. It is also possible to enhance the safety of the system at large because the system does not permit the entry of a driving signal until it checks the safety of the entire system.

Further, because the sensor portion can detect the degradation of properties of the semiconductor element portion, the system can intercept the load circuit via the for-safety intercepting circuit before the system falls to a complete failure, or can direct, by delivering an alarm, the attention of the operator to a disorder to urge him to arrest the system before the system falls to a dangerous state. This will result in the further improvement of the safety of the system.

According to the semiconductor relay system of this invention, because it is possible to quickly detect a disorder in the semiconductor element portion, it is possible to improve the safety of the device. It is also possible to enhance the safety of the system at large because the system does not permit the entry of a driving signal until it checks the safety of the entire system.

What is claimed is:

1. A semiconductor relay system comprising a semiconductor element portion which is inserted between terminals to connect/intercept passage of alternating current between the terminals in response to an element driving signal, and further comprising:

a both-end voltage detection circuit which detects a both-end voltage applied to both ends of the semiconductor element portion, which determines whether or not the both-end voltage stands within a predetermined detection threshold range, and which generates an across-element voltage detection signal with a predetermined pulse width based on the results of the determination; and an element disorder detecting circuit determines for the presence/absence of a disorder in the semiconductor element portion, based on the presence/absence of the element driving signal and the presence/absence of the across-element voltage detection signal.

2. A semiconductor relay system as described in claim 1 wherein:

the element disorder detecting circuit comprises:

a logic-based judgement circuit which outputs a logic-based judgement signal based on the presence/absence of the across-element voltage detection signal and the presence/absence of the element driving signal; and a filtration circuit which outputs an element safety signal reflecting the presence/absence of a disorder in the semiconductor element portion based on the logic-based judgement signal.

3. A semiconductor relay system as described in claim 1 comprising a power circuit for supplying power at least to either the both-end voltage detection circuit or the element disorder detecting circuit, wherein;

the power circuit is supplied power by a load power circuit connected to the terminals.

4. A semiconductor relay system comprising a load circuit for driving a load being energized by a load power supply, and a semiconductor element portion for controlling the load circuit, further comprising:

a dummy load portion connected in parallel with the load;

a for-safety intercepting portion having a contact for connecting/intercepting the load with or from the load power supply in the load circuit; and a control circuit for controlling the dummy load portion, semiconductor element portion and for-safety intercepting portion, wherein the control circuit ensures a current route of the semiconductor element portion in the dummy load portion then performs a disorder detection operation in the semiconductor element portion, and when a disorder in the semiconductor element portion has been detected, intercepts the load from the load power supply by the for-safety intercepting portion.

5. A semiconductor relay system comprising:

a load circuit for driving a load being energized by a load power supply;

a for-safety intercepting portion having contacts through which connection/interception of the load with/from the load power supply is achieved in the load circuit;

a dummy load portion which enables disorder detection by insuring a route for the passage through the semiconductor element portion in case passage through the load is intercepted; and a control means, which puts the system into an initial check state when power is turned on during a state where no power is supplied to the semiconductor element portion, dummy load portion and for-safety intercepting portion, and then checks for the presence of disorder in the for-safety intercepting portion; when it finds, based on the detection result, the for-safety intercepting portion is not in disorder, checks for the presence of disorder in the semiconductor element portion; and when it finds, based on the detection result, the semiconductor element portion is not in disorder, insures connection of the for-safety intercepting circuit, thereby putting the load circuit into operation.

6. A semiconductor relay system as described in claim 5 wherein:

the control means, when it finds the for-safety intercepting portion is normal, checks for the presence of disorder in the semiconductor element portion for a definite period by insuring a route in the dummy load portion for the current passing through the semiconductor element portion; and when it finds the semiconductor element portion is normal, discontinues disorder detection of the semiconductor element portion, and insures connection of the for-safety intercepting portion to put it into operation, thereby activating the load circuit.

7. A semiconductor relay system as described in claim 5 wherein:

the control means, when it finds the for-safety intercepting portion is in disorder, does not check the semiconductor element portion for the presence of disorder in the dummy load portion, thereby preventing the load circuit from being activated, and when it finds the semiconductor element portion is in disorder, controls such that the load circuit is kept from being activated.

8. A semiconductor relay system as described in claim 5 comprising an element driving circuit for driving the semiconductor element portion by delivering an element driving signal, wherein:

the control means monitors the for-safety intercepting portion, and when it finds the contacts of the for-safety intercepting portion are not open, the control means prevents the element driving circuit from delivering an element driving signal.

9. A semiconductor relay system as described in claim 5 wherein:

the control means controls such that, when power supply is turned on, current is passed through the semiconductor element portion via the dummy load, thereby checking the semiconductor element portion for normality, and when the normality is confirmed, the contacts of the for-safety intercepting portion are closed.

10. A semiconductor relay system as described in claim 5 comprising an element disorder detecting circuit for detecting a disorder in the semiconductor element portion, wherein:

the control means controls such that when the element disorder detecting circuit detects the semiconductor element portion is in disorder during normal operation, the contacts of the for-safety intercepting portion are opened.

11. A semiconductor relay system as described in claim 5 wherein:

the control means controls such that the contacts of the for-safety intercepting portion are opened when the system is put out of operation.

12. A semiconductor relay system comprising:
- a load circuit for driving a load being energized by a load power supply;
- a semiconductor element portion for controlling the load circuit;
- an element driving circuit for driving the semiconductor element portion via an element driving signal;
- a for-safety intercepting portion having contacts through which connection/interception of the load with/from the load power supply is achieved in the load circuit;
- a sensor portion for monitoring the operation of the semiconductor element portion;
- an element disorder detecting circuit for detecting disorder in the semiconductor element portion by comparing a sensor output signal from the sensor portion with an element driving signal from the element driving circuit, and for delivering an element safety check signal, when it finds the semiconductor element portion is in disorder;
- a dummy load portion which enables disorder detection by insuring a route for the passage through the semiconductor element portion in case passage through the load is intercepted;
- an intercepting circuit monitoring circuit which, when it finds the for-safety intercepting portion is normally operable, delivers an intercepting relay safety check signal;
- an initial control circuit which, when power is turned on, activates the dummy load portion to enable the safety of the semiconductor element portion to be checked, intercepts the entry of a control input signal from outside, thereby allowing an element portion initial check signal to enter the element driving circuit, and a for-safety intercepting portion check signal to enter the intercepting circuit monitoring circuit, so as to check the welding of contacts of the for-safety intercepting portion; and
- a logic circuit which delivers a safety check signal to the for-safety intercepting portion when it finds the element safety check signal and the intercepting relay safety check signal rising to a high level.

13. A semiconductor relay system as described in claim 5 wherein:
the for-safety intercepting portion is constituted of an intercepting relay consisting of a safety relay.

14. A semiconductor relay system as described in claim 5 wherein:
the for-safety intercepting portion is constituted of an electromagnetic relay having at least one contact which is normally kept open.

15. A semiconductor relay system as described in claim 5 wherein:
the for-safety intercepting portion is constituted of a safety relay and a common relay.

16. A semiconductor relay system as described in claim 5 wherein:
the for-safety intercepting portion is constituted of a semiconductor element having a high voltage tolerance.

17. A semiconductor relay system as described in claim 5 wherein:
control of the intercepting relay of the for-safety intercepting portion is introduced at any time as needed by means of an element driving signal fed to the semiconductor element portion.

18. A semiconductor relay system as described in claim 5 wherein:
the dummy load portion is inserted between the semiconductor element portion and the for-safety intercepting portion, in parallel with the load.

19. A semiconductor relay system as described in claim 5 wherein:
the dummy load portion comprises a resistance and an electromagnetic relay connected in series.

20. A semiconductor relay system as described in claim 5 wherein:
the dummy load portion comprises a resistance.

21. A semiconductor relay system as described in claim 5 wherein:
the dummy load portion comprises a resistance through which only a negligibly small current is allowed to pass, as compared with the load current.

22. A semiconductor relay system as described in claim 5 wherein:
the electromagnetic relay included in the dummy load portion comprises "b" contacts of the same safety relay with that used in the for-safety intercepting portion.

23. A semiconductor relay system as described in claim 5 wherein:
the sensor portion may comprise a voltage detecting circuit for detecting voltage across the semiconductor element portion.

24. A semiconductor relay system as described in claim 12 wherein:
the sensor portion may comprise a current detecting circuit for detecting current flowing through the semiconductor element portion.

25. A semiconductor relay system as described in claim 12 wherein:
each of the sensor portion and the element disorder detecting circuit is paired so that for each of them, if one pair is broken, the other can be readily introduced to insure normal operation.

26. A semiconductor relay system as described in claim 6, which has a function to forcibly open the for-safety intercepting portion in response to a safety control signal from outside.

27. A semiconductor relay system as described in claim 5, which has a function to deliver a safety control signal to outside, and a function to modify the signal, when it detects a disorder in its interior, such that the signal can inform of the disorder.

28. A semiconductor relay system as described in claim 5 working on a three phase power supply wherein:
the for-safety intercepting portion is configured in such a way as to intercept two phases of current.

29. A method for controlling a semiconductor relay system whereby:
the system introduces an initial check state when power is turned on at a state where no power is supplied to the semiconductor element portion, dummy load portion and for-safety intercepting portion, thereby checking the for-safety intercepting portion whether it is in disorder or not;
when the system finds the for-safety intercepting portion is not in disorder based on the check result, the system checks the semiconductor element portion whether it is in disorder or not, and when the system finds the semiconductor element portion is not in disorder based on the check result, the system insures connection of the for-safety intercepting portion, thereby putting the load into continuous activation; whereas when the system finds the for-safety intercepting portion is in disorder based on the check result, the system does not exercise disorder check for the dummy load portion, but controls such that the load circuit is kept from being activated, and further when the system finds the semiconductor element portion is in disorder based on the check result, the system controls such that the load circuit is kept from being activated.

* * * * *